United States Patent [19]
Bertolet et al.

[11] Patent Number: 5,748,009
[45] Date of Patent: May 5, 1998

[54] PROGRAMMABLE LOGIC CELL

[75] Inventors: Allan Robert Bertolet, Williston; Kim P. N. Clinton, Essex Junction; Christine Marie Fuller, Williston; Scott Whitney Gould, South Burlington; Steven Paul Hartman, Jericho; Joseph Andrew Iadanza, Hinesburg; Frank Ray Keyser, Colchester; Eric Ernest Millham, St. George; Timothy Shawn Reny, Underhill Center; Brian A. Worth, Milton; Gulson Yasar, South Burlington; Terrance John Zittritsch, Williston, all of Vt.

[73] Assignee: International Business Machines Corporation, Armonk, N.Y.

[21] Appl. No.: 707,840

[22] Filed: Sep. 9, 1996

Related U.S. Application Data

[62] Division of Ser. No. 460,481, Jun. 2, 1995, Pat. No. 5,646,546.

[51] Int. Cl.$^6$ ............................................. H03K 19/177
[52] U.S. Cl. ................................................. 326/39; 326/41
[58] Field of Search ..................................... 326/39, 40, 41

[56] References Cited

U.S. PATENT DOCUMENTS

| | | | |
|---|---|---|---|
| Re. 34,363 | 8/1993 | Freeman | 326/38 |
| 3,691,401 | 9/1972 | Forlani et al. | 326/115 |
| 4,558,236 | 12/1985 | Burrows | 326/50 |
| 4,609,986 | 9/1986 | Hartmann et al. | 364/200 |
| 4,617,479 | 10/1986 | Hartmann et al. | 326/45 |
| 4,642,487 | 2/1987 | Carter | 326/41 |
| 4,706,216 | 11/1987 | Carter | 365/94 |
| 4,758,745 | 7/1988 | Elgamal et al. | 326/41 |
| 4,774,421 | 9/1988 | Hartmann et al. | 326/44 |
| 4,789,951 | 12/1988 | Birkner et al. | 364/716 |
| 4,963,770 | 10/1990 | Keida | 326/40 |
| 4,999,687 | 3/1991 | Luryi et al. | 326/54 |
| 5,003,200 | 3/1991 | Sakamoto | 326/38 |
| 5,019,736 | 5/1991 | Furtek | 326/41 |

(List continued on next page.)

OTHER PUBLICATIONS

Oakland, S.F., "CMOS Selectable NAND–NOR Circuit," IBM Technical Disclosure Bulletin, vol. 33, No. 3B, Aug. 1990, 385–387.

Trevilyan, L., "An Experiment in Technology Mapping for FPGAs Using a Fixed Library," IWLS '93 Workshop Notes, P9c-1–P9c-6.

Atmel Corporation, "Field Programmable Gate Arrays AT6000 Series," San Jose, Copyright 1993; pp. 1–16.

Atmel Corporation, "Application Note At6000 Series Configuration;," Revision 1B, San Jose, May 1993, 1–16.

*Primary Examiner*—Edward P. Westin
*Assistant Examiner*—Benjamin D. Driscoll
*Attorney, Agent, or Firm*—Heslin & Rothenberg, P.C.

[57] ABSTRACT

A programmable logic cell has four logic gates, two of which are configurable. The two configurable logic gates are positioned near the logic cell inputs. Each configurable logic gate has two inputs, each input being connected to one of the four logic cell inputs. The remaining two logic gates receive the outputs of the configurable logic gates. Four independent logic cell input nodes are provided, each having associated therewith a programmable input multiplexer. Each input multiplexer can have inputs connected to at least two types of interconnect conductors. The cell also has two output paths, each having associated therewith an independently-controlled output multiplexer. The output of each output multiplexer is connected to an input of the other output multiplexer. Additional features include a multiplexer having inputs connected to two cell input nodes, a select input connected to a third logic cell input node, and an output connected to a cell output node; a system low-skew data (e.g., clock) input available to at least one of the input multiplexers; a flip-flop connected within the logic cell; and internal cell feedback. The preferred method of programming utilizes user-programmed SRAM memory cells.

15 Claims, 12 Drawing Sheets

U.S. PATENT DOCUMENTS

| | | | |
|---|---|---|---|
| 5,028,821 | 7/1991 | Kaplinsky | 326/41 |
| 5,055,718 | 10/1991 | Galbraith et al. | 326/46 |
| 5,073,729 | 12/1991 | Greene et al. | 326/47 |
| 5,144,166 | 9/1992 | Camarota et al. | 326/41 |
| 5,155,389 | 10/1992 | Furtek | 326/39 |
| 5,185,706 | 2/1993 | Agrawal et al. | 364/489 |
| 5,189,320 | 2/1993 | Gongwer | 326/41 |
| 5,212,652 | 5/1993 | Agrawal et al. | 364/489 |
| 5,231,588 | 7/1993 | Agrawal et al. | 364/489 |
| 5,241,224 | 8/1993 | Pedersen et al. | 326/41 |
| 5,245,227 | 9/1993 | Furtek et al. | 326/38 |
| 5,291,079 | 3/1994 | Goetting | 326/38 |
| 5,298,805 | 3/1994 | Garverick et al. | 326/37 |
| 5,302,866 | 4/1994 | Chiang et al. | 326/40 |
| 5,309,045 | 5/1994 | Saeki et al. | 326/39 |
| 5,317,698 | 5/1994 | Chan | 395/325 |
| 5,319,254 | 6/1994 | Goetting | 326/21 |
| 5,323,069 | 6/1994 | Smith, Jr. | 326/47 |
| 5,327,023 | 7/1994 | Kawana et al. | 326/39 |
| 5,331,226 | 7/1994 | Goetting | 326/44 |
| 5,338,983 | 8/1994 | Agarwala | 326/41 |
| 5,341,044 | 8/1994 | Ahanin et al. | 326/41 |
| 5,359,536 | 10/1994 | Agrawal et al. | 364/489 |
| 5,399,922 | 3/1995 | Kiani et al. | 326/40 |

PROGRAMMABLE LOGIC CELL

RELATED APPLICATION INFORMATION

This application is a division of U.S. patent application Ser. No. 08/460,481 filed Jun. 2, 1995, now U.S. Pat. No. 5,646,546, relates to commonly owned concurrently filed U.S. Patent Applications:

1. Ser. No. 08/459,579, Docket No.: BU9-95-025, entitled "PROGRAMMABLE ARRAY INTERCONNECT NETWORK" now U.S. Pat. No. 5,631,578;
2. Ser. No. 08/460,420, Docket No.: BU9-95-023, entitled "PROGRAMMABLE ARRAY I/O—ROUTING RESOURCE" now U.S. Pat. No. 5,671,432;
3. Ser. No. 08/459,156, Docket No.: BU9-95-024, entitled "PROGRAMMABLE ARRAY CLOCK/RESET RESOURCE" now U.S. Pat. No. 5,652,529;

The section entitled "Description of the Preferred Embodiment(s)," and the drawings, from each of the above-referenced related U.S. patent applications are hereby expressly incorporated herein by reference.

TECHNICAL FIELD

This invention relates in general to integrated circuit devices, and, more specifically, to programmable integrated circuit devices having a plurality of programmable logic cells and a programmable interconnection network.

BACKGROUND OF THE INVENTION

Programmable integrated circuits are known in the art and include programmable logic devices ("PLDs"), Programmable Array Logic ("PALs"), and Programmable Logic Arrays ("PLAs"). Each of these programmable circuits provides an input AND logic plane followed by an OR logic plane. An output function can thus be calculated which is the sum of the products of the input terms. The logic planes are usually programmable such that the initial general layout of the planes may be customized for a particular application.

A more general approach to programmable circuits involves providing an array of distinct, uncommitted logic cells in a Programmable Gate Array ("PGA"). A programmable interconnect network is usually provided to interconnect the cells, and to provide data input to, and output from, the array. Customization or programming of the otherwise generally-designed logic cells and interconnect network is performed for a particular application. One such array is a Mask Programmable Gate Array ("MPGA"), wherein the configuration of the cells and the wiring network occurs when adding the final layers of metallization to an integrated circuit. A modified approach involves the use of laser-directed energy to customize the metallization pattern. Another such array is a Field Programmable Gate Array ("FPGA"), wherein the configuration can be performed by a user, in the "field." Such configuration may be effected by using electrically programmable fusible links, antifuses, memory-controlled transistors, floating-gate transistors, or the like.

Regardless of the type of programming employed, the basic logic functions of a given FPGA or MPGA are in large part defined by the capabilities of the uncommitted or unprogrammed logic cell, and its interface to the interconnect network.

Several approaches have developed in the art for the implementation of programmable logic cells. The first, generally referred to as the Look-Up Table ("LUT") approach, involves using a memory unit inside of each logic cell which stores a user-defined output function for each of the possible combinations of input terms. For example, a 4-input, 1-output LUT may comprise a $2^4 \times 1$-bit memory. Thus, a 1-bit value is defined (by the user) for each of the 16 different possible input combinations, and that value is selected (and output) when that combination occurs. However, there are actually $2^{16}$ or 65,536 possible combinations of memory states for the $2^4 \times 1$-bit memory. This large number of potential memory states may cause design problems if common fixed-library technology is employed for technology mapping user circuit designs onto LUTs.

Another approach to logic cell implementation involves using standard cells, and programmable signal selection within and about the cell. FIG. 1 depicts an example of a currently known standard cell 10. Fixed logic gates 12a–d are employed in a parallel, cascaded formation. The inputs to the cell from a wiring network can be selected with multiplexers 14a–c, and the available output logic signals 16a and 16b can be selectively applied to the cell output nodes 18a and 18b, respectively. About 44 different programmed configurations are presently available in one commercial product which employs this cell, which is a relatively small number of functions when compared with the large number available with the 4-input LUT discussed above. Fixed-library technology mapping, however, is easily implemented using this type of cell.

Another important concern of PGA designers involves the level of connectivity between the interconnect network and the logic cell. A higher level of connectivity will ease the place and route design cycle and improve the overall flexibility of the system. In the prior art system of FIG. 1, input signal lines 20a and 20b are "direct" connections from adjacent cells. In addition, only a single, separate switching system 22 is provided for input from, and output to, the four "L" buses (which, in this particular array, constitute general connections between any of the logic cells in the array). This level of connectivity is somewhat restrictive.

What is needed, therefore, is a standard cell which can employ widely-available fixed-library mapping technology, but which can also provide much of the high functionality of a LUT-based cell. In addition, a higher level of connectivity between the cell and the surrounding interconnect network is desirable to increase the overall flexibility of the array.

SUMMARY OF THE INVENTION

Briefly summarized, the present invention, in one aspect, is a programmable logic cell including first and second logic gates. Each of the first and second logic gates has at least two inputs, an output, and a control node. Each of the first and second logic gates is configurable to perform one of a predetermined set of logic functions on logic signals supplied to its respective at least two inputs. Each of the first and second logic gates is configured using its respective control node.

The cell further includes third and fourth logic gates. Each of the third and fourth logic gates has first and second inputs, the first input of at least one of the third and fourth logic gates being connected to the output of the first logic gate, the second input of at least one of the third and fourth logic gates being connected to the output of the second logic gate. Each of the third and fourth logic gates further includes an output.

The programmable logic cell may include a first multiplexer and a second multiplexer, wherein the first multiplexer has a first input connected to the output of the first logic gate and a second input connected to the output of one of the third logic gate and the fourth logic gate. The second multiplexer has a first input connected to the output of the second logic gate, and a second input connected to the output of one of the third logic gate and the fourth logic gate. The outputs of each of the first and second multiplexers are routed back into an available input of the other respective multiplexer.

The programmable logic cell may further include a data storage circuit having an input connected to the output of the fourth logic gate, and an inverter having an input connected to the output of the third logic gate. In this configuration, the first multiplexer of the programmable logic cell has a first input connected to the output of one of the first logic gate, the inverter, and the data storage circuit, and may include a second input connected to the output of the second multiplexer. The second multiplexer would include a first input connected to the output of one of the second logic gate, the third logic gate and the fourth logic gate, and may further include a second input connected to the output of the first multiplexer.

The programmable logic cell may include a first programmable inverter having an input connected to a first cell input node, an output connected to one of the two inputs of the first logic gate, and a control node such that a signal presented at the first cell input node may be controllably inverted or not before being passed to one of the two inputs of the first logic gate. The logic cell may further include a second programmable inverter having an input connected to a second cell input node, an output connected to one of the two inputs of the second logic gate, and a control node such that a logic signal presented at the second cell input node may be controllably inverted or not before being passed to one of the two inputs of the second logic gate.

A single memory means may be provided, connected to the control nodes of the first and second logic gates, for commonly configuring both the first and second logic gates. A single memory means may be provided, connected to the control nodes of the first and second programmable inverters, for commonly controlling both the first and second programmable inverters.

The predetermined set of logic functions of the first and second logic gates may consist of a NAND function and a NOR function. The third logic gate may be a NAND gate, and the fourth logic gate may be an XNOR gate.

In another aspect of the invention, a programmable logic cell is provided having a cell input node and a plurality of combinational or sequential logic circuits. The programmable logic cell may further include an inverter circuit for programmably inverting an input logic signal, the inverter circuit having an inverter input node connected to the cell input node for accepting the input logic signal, an inverter output node for providing logic signals to one of the plurality of combinational or sequential logic circuits, and an inverter control node. The inverter is programmable into a first state wherein a logic signal representing the complement of the input logic signal is provided to the inverter output node, and a second state wherein a logic signal representing the non-complement of the input logic signal is provided to the inverter output node. The inverter circuit buffers the input logic signal in both said first and second states.

The inverter circuit may comprise an XNOR circuit having first and second inputs, wherein the first input of the first XNOR circuit is the inverter input node, the second input of the XNOR circuit is the inverter control node, and the output of the XNOR circuit is the inverter output node.

In yet another aspect of the invention, a programmable integrated circuit array is provided having a plurality of logic cells arranged therein, and an interconnect network. The interconnect network includes a first plurality of interconnect conductors for carrying signals to or from a first one of the plurality of logic cells. The first one of the plurality of logic cells includes four logic input nodes, two logic output nodes and four input multiplexers. Each input multiplexer has an output connected to a corresponding one of the four logic input nodes. First and second ones of the four input multiplexers each has a first plurality of inputs connected to each of the first plurality of interconnect conductors. The cell further includes four programmable input inverters wherein each programmable input inverter has an input node connected to a corresponding one of the four logic input nodes. Each programmable input inverter further includes an output node. The cell further includes first and second logic gates, each gate having two inputs, and each being configurable to perform one of a predetermined set of functions on signals at their inputs. Each of the two inputs of each of the first and second logic gates is connected to a corresponding one of the output nodes of the four programmable input inverters.

The first logic cell of the integrated circuit array may further include an output multiplexer having an input for receiving a logic state from either of the two logic output nodes. The output multiplexer further includes a plurality of outputs connected to each of the first plurality of interconnect conductors. The output multiplexer is generally independent of each of the four input multiplexers.

The first logic cell of the programmable integrated circuit array may further include third and fourth logic gates. Each of the third and fourth logic gates has a first and a second input. The first inputs of the third and fourth logic gates both are connected to an output of the first logic gate, and the second inputs of the third and fourth logic gates both are connected to an output of the second logic gate.

The plurality of logic cells of the integrated circuit array may further include a plurality of proximate logic cells positioned proximate to the first logic cell. The interconnect network in this case includes a second plurality of interconnect conductors for carrying signals generally directly from each of the plurality of proximate logic cells to the first logic cell. At least a third one of the four input multiplexers comprises a plurality of inputs, each of the plurality of inputs being connected to a respective one of the second plurality of interconnect conductors.

A variety of signals other than those carried on the interconnect network can be applied to the input multiplexers including a low-skew signal from a low-skew signal network (e.g., clock), a logic state "0," and a logic state "1." The first logic cell may further include a feedback path between one of the two logic output nodes and an input of one of the four input multiplexers, and the feedback path may include an inverter or buffer.

The present invention, as summarized above, provides a standard cell which can be programmed using widely available fixed-library mapping technology, and which also provides much of the high functionality of a LUT-based cell. An accordingly large number of functions can be implemented in the cell. A much higher level of connectivity between the cell and the interconnect network is also provided to increase the overall flexibility of the array.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

Description of the Preferred Embodiment(s)

Figure 2:
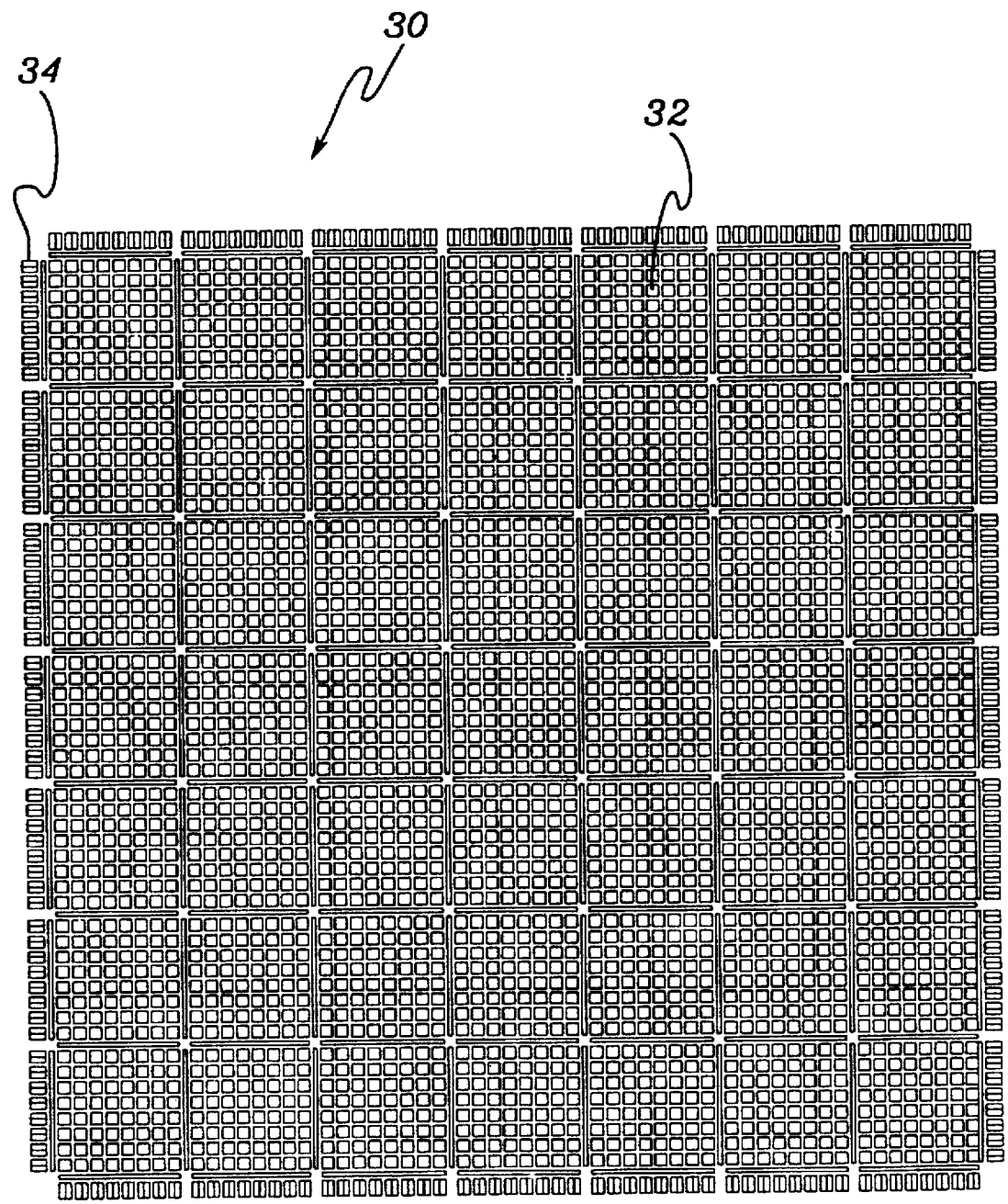
FIG. 2 illustrates a programmable gate array having a plurality of programmable logic cells pursuant to the principles of the present invention arranged therein.

With reference to FIG. 2, there is shown a layout of a programmable gate array 30 comprising a plurality of logic cells 32. In this particular embodiment, the plurality of programmable logic cells comprises a 56×56 array of cells divided into sectors of cells, wherein each sector is defined by an 8×8 group of cells. Also depicted are input/output pins 34 along the perimeter of the array which may be used for data input and output. In addition, certain pins may be used as clock pins, reset pins, or for configuration pins for programming the programmable resources of the array 30. The input/output portion of the array can be implemented according to the above-incorporated portions of the U.S. Patent application entitled "PROGRAMMABLE ARRAY I/O—ROUTING RESOURCE."

Figure 3:
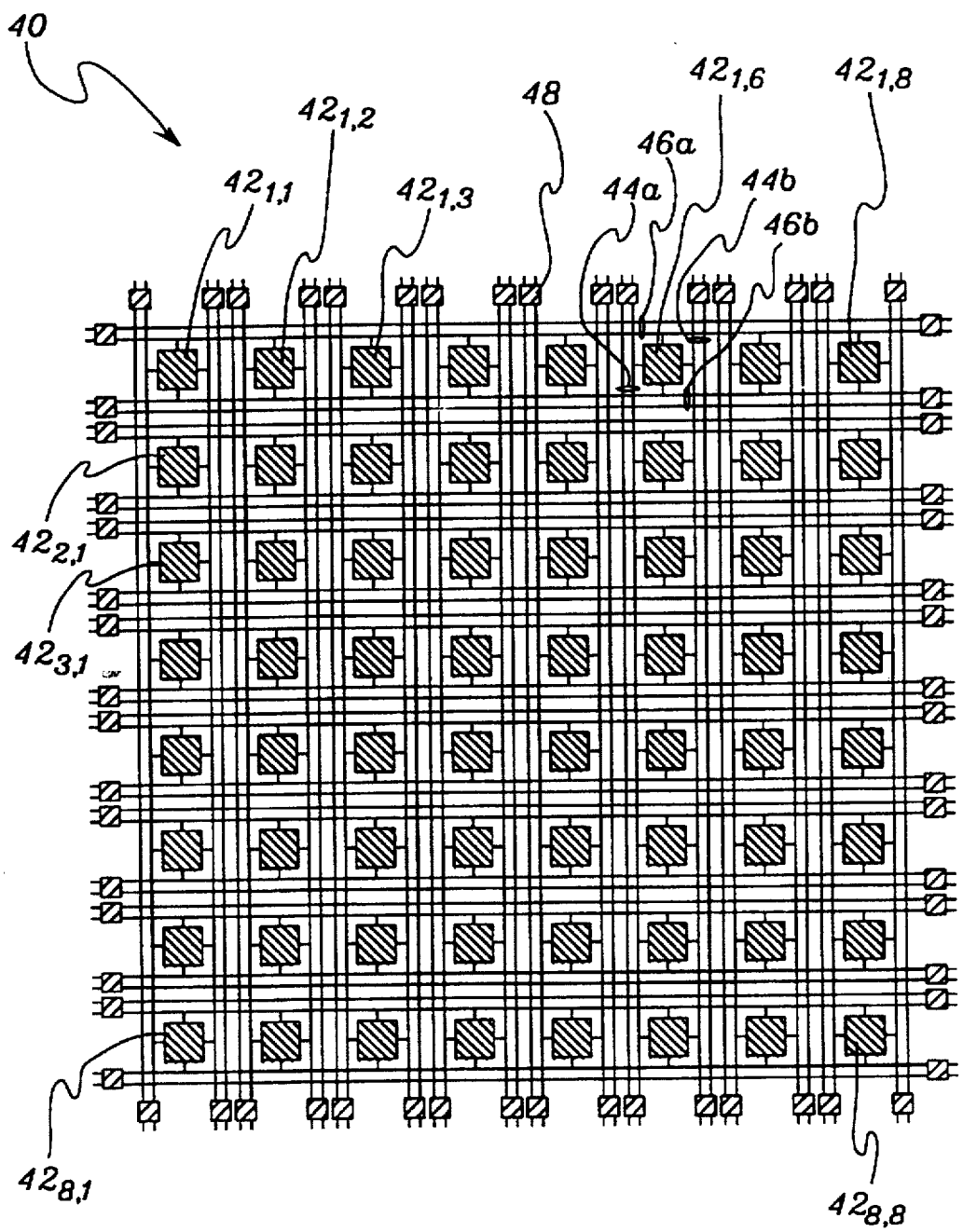
FIG. 3 depicts a portion of a programmable gate array having a plurality of programmable logic cells pursuant to the principles of the present invention arranged therein, and an interconnect network connecting the programmable logic cells.

With reference to FIG. 3, there is shown a single sector 40 of programmable logic cells of the array of FIG. 2. A single sector comprises logic cells $42_{1,1}$ to $42_{8,8}$. With reference to logic cell $42_{1,6}$, the cell is shown generally surrounded by vertical interconnect conductors 44a and 44b, and horizontal interconnect conductors 46a and 46b. These horizontal and vertical interconnect conductors are positioned between each row and column of the array and provide connections between any two logic cells in the array, or between any logic cell in the array and the input/output pins. The interconnect conductors together form the overall interconnect network of the programmable array. Programmable resources within the interconnect network may be provided in addition to those in programmable logic cells. The programmable resources in the interconnect network may include, for example, switching elements 48 which allow signals to be transmitted between two vertical conductors. In addition, bus turns (not shown) may be employed to provide programmable interconnections between a specified vertical and a specified horizontal interconnect conductor. The interconnect network can be implemented according to the above-incorporated portions of the U.S. Patent application entitled "PROGRAMMABLE ARRAY INTERCONNECT NETWORK."

Figures 4, 5:
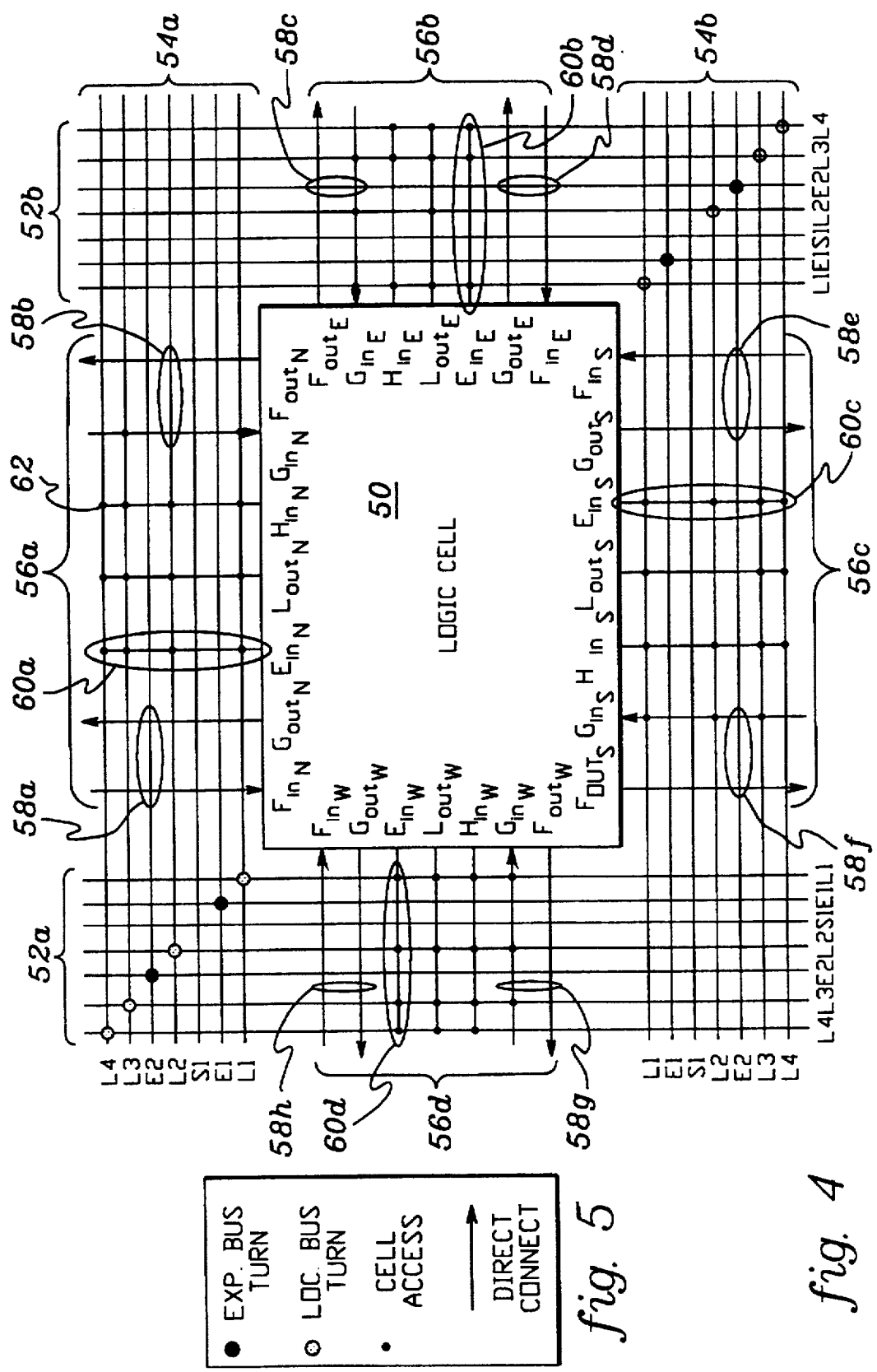
FIG. 4 depicts the connectivity between a single programmable logic cell and the surrounding interconnect network pursuant to the principles of the present invention.
FIG. 5 is a key to symbols employed in FIG. 4.

FIG. 4 depicts, in greater detail, the preferred connections available between a logic cell 50 and the proximate interconnect conductors pursuant to the principles of the present invention. The interconnect conductors include vertical groups 52a and 52b and horizontal groups 54a and 54b. The interconnect definitions are contained within regions 56a-d as indicated by "cell access" point (see key in FIG. 5). It is evident that each vertical and horizontal group contains sevens buses labeled L1-L4, E1-E2, and S1. It is further evident that cell access points are only allotted to the buses labelled L1-L4, the "local" buses, and that no cell connections are maintained between the cell and (longer) buses E1-E2 and S1.

In addition to the connections to the L1-L4 buses, the logic cell maintains direct connections 58a-h to adjacent cells via F and G direct connect buses. Thus, the interconnect network actually comprises sets of general interconnect buses L1-L4, E1-E2 and S1, as well as dedicated, direct-connect buses carrying signals between adjacent logic cells. The inputs to the cell are routed to input nodes labeled E, F, G and H. The subscripts N, S, E and W indicate the direction (i.e., north, south, east and west) of the signal source or destination buses relative to the cell. Those of ordinary skill in the art will recognize that the buses may actually run over the cell, in chip metallization layers, and that there would likely be few, if any, physical distinctions between the parallel N/S and E/W buses.

It should be evident to one of ordinary skill in the art that there are numerous ways of providing the connections generally defined in regions 56a-d of FIG. 4. For example, each cell access point, e.g., cell access point 62, could comprise a pass transistor, an EPROM, a fusible link or an antifuse which effects the desired isolation or connection between the input to the logic cell and the intersecting conductor. A user, upon requiring a connection at any particular access point, would then only be required to perform the proper programming to effect the connection at the access point. A laser-programmed device could also employ optional welds at the access points. The required connections are provided by either including or excluding the welds. A mask-programmed device would simply include or omit the relevant connections. Any structure for signal selection in which before programming, a plurality of signals are available for selection, and after programming, one of the signals is selected, is referred to herein as a multiplexer. A "connection," as used herein regarding these regions and in all other areas, and unless otherwise expressly indicated, broadly denotes either a direct, conductive connection between conductors, or an indirect (e.g., buffered/inverted) interface in which the information from one conductor is nevertheless supplied to the other conductor. Similarly, an "input" or an "output" denotes either a direct or indirect (e.g., buffered/inverted) interface, unless otherwise expressly indicated.

In the presently preferred embodiment, to form the connections, pass gate multiplexers are employed which are controlled by static random access memory (SRAM) cells. The SRAM cells are directly or indirectly (through decoders) tied to the gates of he pass gates within a pass gate multiplexer thus controlling the state of the pass gates. For example, the logic cell includes an $E_{in}$ multiplexer which would control the E input connections 60a–d. In this particular embodiment, a single connection is routed from each potential bus into the source/drain combination of a transmission gate, and the drain/source combination of the transmission gate is routed to the input node of the logic cell. Sixteen such transmission gates may be found in a 16:1 pass gate multiplexer and software and decoding logic of the programming system ensures that only one particular pass gate is activated.

Figure 1:
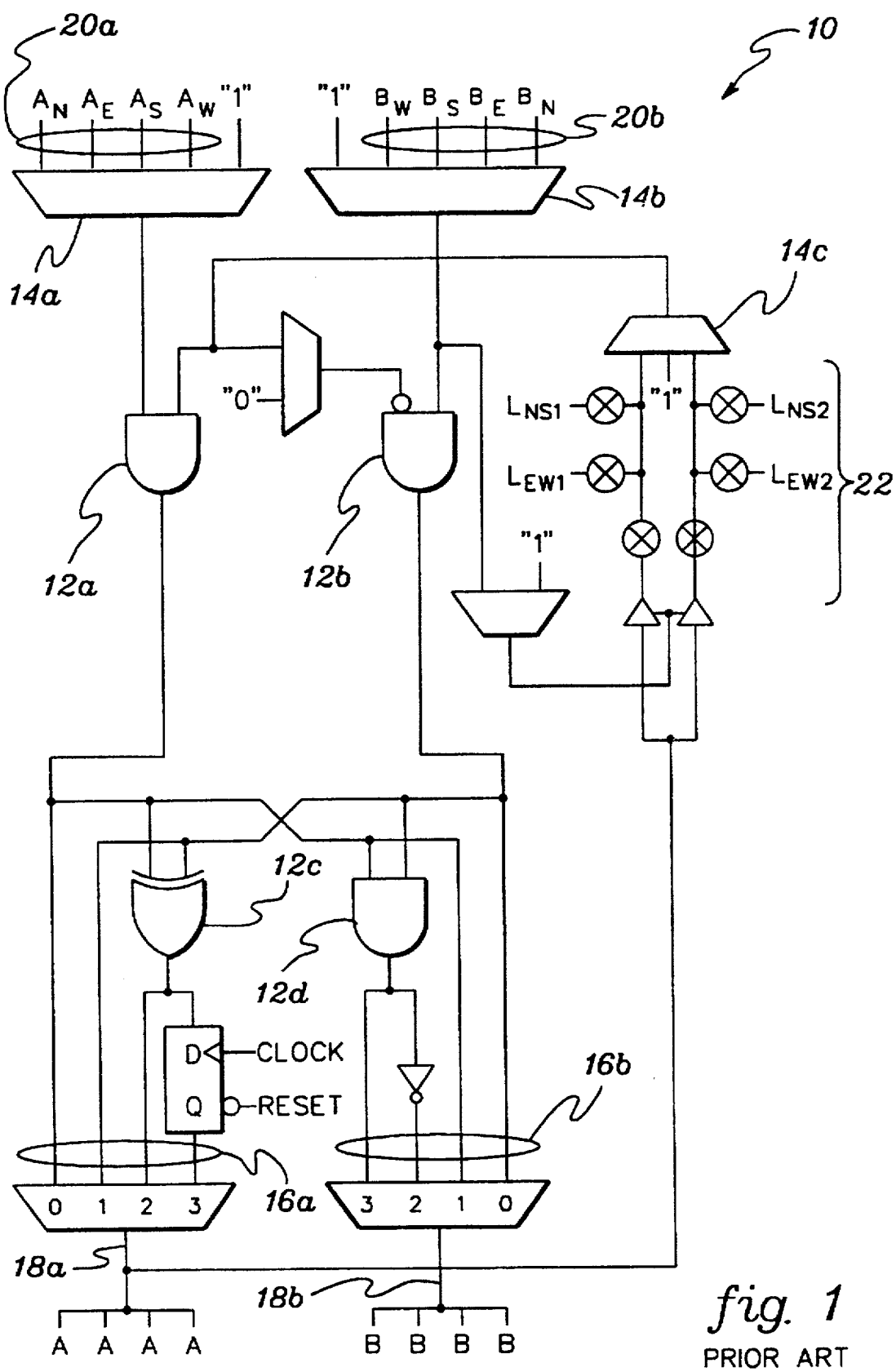
FIG. 1 illustrates an example of a programmable logic cell which is known in the art.

As shown in, for example, connection group 58f, it is also possible to multiplex direct connections from adjacent cells, and connections from the L1, L2 and L3 local buses. Pursuant to the principles of the present invention, a single multiplexer is employed having a single output and an input which combines potential connections from both direct connect and general interconnect busing. In addition, all of the input local buses from groups 52a, 52b, 54a and 54b can be applied to any one of four inputs (E, F (not shown), G, H) of the logic cell 50. Thus, a much higher level of connectivity is provided to the logic cell from the surrounding interconnect conductors via the highly generalized input multiplexing scheme illustrated in FIG. 4, in contrast to the level of connectivity provided in the prior art cell of FIG. 1.

Figure 6:
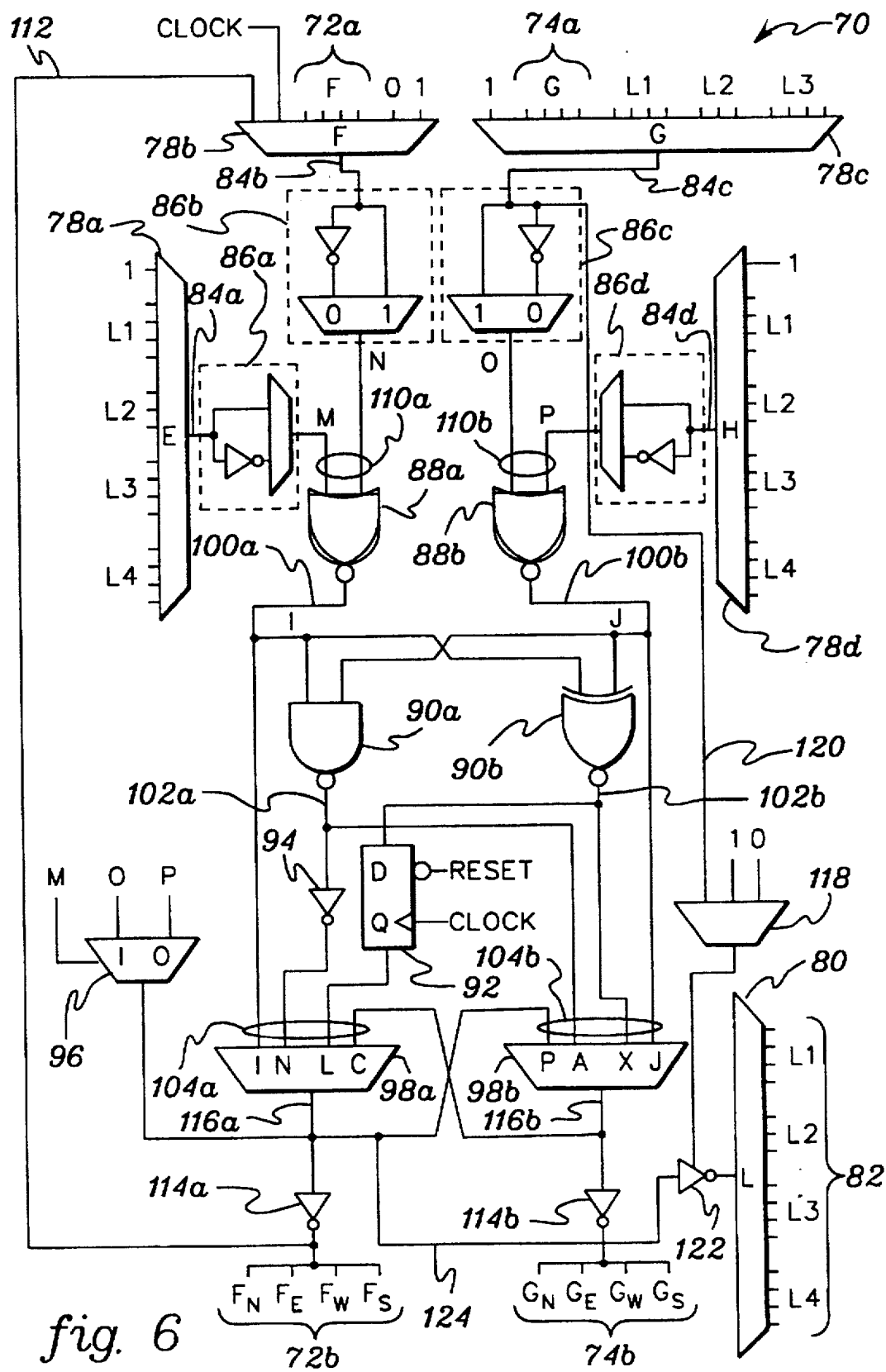
FIG. 6 depicts the elements of a single programmable logic cell pursuant to the principles of the present invention.

FIG. 6 depicts a preferred embodiment of a programmable logic cell 70. Programmable multiplexers 78a–d (E, F, G, H) are provided and in the preferred embodiment comprise pass gate multiplexers controlled by SRAM memory bits. As discussed above with reference to FIG. 4, many of the local buses L1–L4 are provided as inputs to each of the E, G and H multiplexers of the preferred embodiment of FIG. 6. In addition, the F direct connects 72a are provided to input multiplexer 78b, and the G direct connects 74a are provided as inputs to multiplexer 78c. Each of the input multiplexers 78a–d comprises an output node which is coupled to a logic cell input node 84a–d. Thus, pursuant to the principles of the present invention, four independent input nodes are provided in the programmable logic cell.

Also depicted in FIG. 6 are programmable input inverters 86a–d at each of the input nodes 84a–d. The circuits within the dashed boxes comprise a functional drawing only, wherein a multiplexer can be used to select an inverted or non-inverted signal from an input node. A preferred embodiment of the programmable input inverters is described in greater detail below with respect to FIGS. 8a–d.

Each of the outputs of the input inverters (M, N, O, P) is respectively coupled to either configurable logic gate 88a or configurable logic gate 88b. More specifically, nodes M and N comprise inputs 110a to gate 88a and nodes O and P comprise inputs 10b to gate 88b. The two configurable logic gates, each having two independent input nodes, are provided pursuant to the principles of the present invention and are described in greater detail below. Briefly, each configurable logic gate is capable of preforming either a NAND function or a NOR function on its respective inputs. The functions that are performed are determined by programming, and in the preferred embodiment the programming facility comprises an SRAM memory cell having its states routed to a control input of gates 88a and 88b.

The outputs of the configurable logic gates, 100a and 100b, are each coupled to three different destinations in the preferred embodiment. More specifically, output 100a is provided to multiplexer 98a and comprises an input to logic gates 90a and 90b. Output 100b is provided to gates 90a and 90b, and to multiplexer 98b. Logic gates 90a and 90b thus comprise a second level of logic functions, but, unlike configurable logic gates 88a and 88b, are fixed in the preferred embodiment, i.e., gate 90a comprises a NAND gate and 90b comprises an XNOR gate. Gates 90a and 90b could also be configurable logic gates, in other embodiments. The implementation of the XNOR gate is discussed in further detail below with respect to FIG. 9. The output 102a of gate 90a is provided to multiplexer 98b and inverter (or buffer) 94. The output 102b of gate 90b is provided to a flip-flop 92 and also to multiplexer 98b. Both of the outputs of the inverter and the flip-flop are provided to multiplexer 98a.

Pursuant to the principles of the present invention, multiplexers 98a and 98b receive inputs 104a and 104b, respectively, and are independently controllable to provide any one of the inputs to a respective cell output node 116a or 116b. Inputs 104a include a connection from the output of multiplexer 98b, and inputs 104b include a connection to the output of multiplexer 98a. Thus, any one of the six generally available logic outputs from the cell is available to either of the two output nodes 116a and 116b. Multiplexers 98a and 98b comprise pass gate multiplexers controlled by SRAM bits in the preferred embodiment, however, can be formed using any of the multiplexing structures discussed above.

Also depicted is a multiplexer 96 having an output connected to output node 116A, a control node connected to the output of inverter node M (connection not shown), and inputs O and P connected (connection not shown) to output inverter nodes O and P. Thus, according to the principles of the present invention, a 2:1 multiplexing function can be easily implemented using the logic cell and a single stage of multiplexing, rather than employing the logic gates. If the logic gates are employed, the select input must be double-wired which leads to routing and timing problems. Multiplexer 96 is controlled by the logic cell signal present at node M. Additional detail regarding the control of multiplexer 96 is provided below with respect to FIG. 11.

The distribution of the signals at the output nodes 116a and 116b is as follows. An inverter (or buffer) 114a can be provided at node 116a which drives the outputs to direct connects 72b. Each one of these direct connection outputs is routed to one of the respective four adjacent neighboring cells. Similarly, inverter (or buffer) 114b may be added to output node 116b. The output of the inverter is then routed to the direct connect output 74b which comprises a connection to each of the respective adjacent cells. In addition, output 116a can be provided via line 124 to a tri-state inverter 122. Tri-state inverter can drive an output multiplexer 80 which, pursuant to the principles of the present invention, can drive signals to each of the L1–L4 buses. This multiplexer operates to independently drive the L buses 82. The tri-state inverter 122 may be controlled via multiplexer 118. The inputs to multiplexer 118 can either comprise a user-defined signal on line 120 which emanates from the G input node 84c, or a fixed "1" or "0" input. Additional detail regarding the control of multiplexers 118 and 80 is provided below with respect to FIG. 12. Again, multiple structures are known to those skilled in the art to provide the multiplexing functions. In the preferred embodiment, multiplexer 118 is a 2:1 AOI (and-or-invert), and multiplexer 80 is implemented with pass gates having gates controlled by SRAM memory cells.

Other features of the programmable core cell include the fixed logic state "1" being available to each of the four input multiplexers 78a–d. Note that an L2 input is eliminated from multiplexers 78a, 78c and 78d to provide this fixed input while maintaining only 16 possible states at each multiplexer. One of the pluraltiy of L2 buses is also eliminated from multiplexer 80, which results in an extra control state, discussed further below with respect to FIG. 12. Further, a fixed logic state "0" is available to input multiplexer 78b. Also available at multiplexer 78b is a feedback signal 112 derived from cell output node 116a. Finally, a clock input is also available to input multiplexer 78b. This clock input is, in addition to the clock input to flip-flop 92, normally provided from a system clock resource. Thus, pursuant to the principles of the present invention, the clock signal is directly available to any of the logic within the logic cell. Without this clock input, to gain access to the clock signal, the clock would be run at two times the desired speed and the "Q" output of the flip-flop would need to be sampled, and the feedback path would be employed to pass the sampled clock signal back into the two multiplexers 78b. Thus, the resources of the logic cell must be dedicated to this sampling and feedback function if the clock signal is not directly provided. The clock distribution throughout the array can be accomplished according to the above-incorporated portions of the U.S. Patent application entitled "PROGRAMMABLE ARRAY CLOCK/RESET RESOURCE." As discussed in that application, the clock network can also be used as a low skew data network. Thus, pursuant to the principles of the present invention, a generally low skew data signal is provided to the multiplexer 78b.

Figure 7:
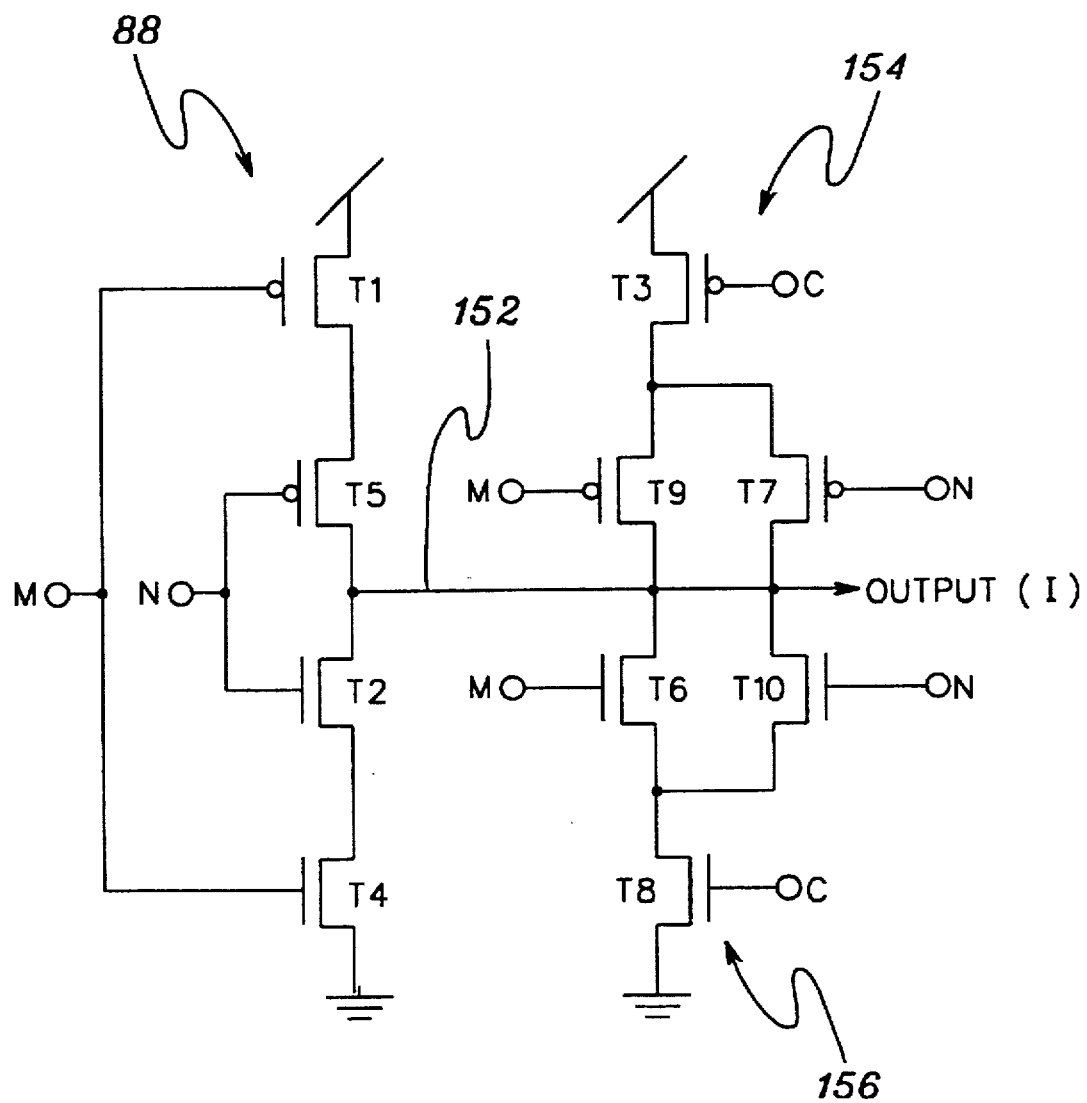
FIG. 7 is a schematic of a configurable logic ate employed in the programmable logic cell pursuant to the principles of the present invention.

A preferred embodiment of the configurable logic gates 88a–b is depicted in detail in FIG. 7. (Those skilled in the art will recognize that the "T" designations used for the transistors in the following schematics do not generally designate the same transistors if they are repetitively used in separate schematics.) The following discussion applies to either of the gates 88a or 88b, and their respective inputs and outputs. The circuit of FIG. 7 comprises p-channel transistors T1, T3, T5, T7, and T9; and n-channel transistors T2, T4, T6, T8 and T10. The inputs to the circuit include logic signals from nodes M and N (shown in FIG. 6) and a control signal input to p-channel transistor 154 and n-channel transistor 156. This preferred configurable logic gate is designed to perform a NAND function if the control signal is logic "0," and a NOR function if the control signal is logic "1." Note that the control transistors 154 and 156 have been placed closer to their respective voltage supplies such that the output signal is advantageously driven directly by transistors T7, T9, T6 and T10. One feature of this configurable logic gate is that node 152 comprises a commonly-connected node for either the NAND circuit or the NOR circuit. The alternative to providing this shared configuration is to provide separate NAND and NOR circuits having outputs feeding a multiplexer. Such an approach would use significantly more space than the circuit of FIG. 7. The control signal "C" can be provided via a programming facility which, in the preferred embodiment, comprises an SRAM memory cell.

A truth table for each of the NAND and NOR follows and includes the state of the N, M and I nodes.

| M | N | I |
|---|---|---|
| C = 0 (NAND): | | |
| 0 | 0 | 1 |

| M | N | I |
|---|---|---|
| 0 | 1 | 1 |
| 1 | 0 | 1 |
| 1 | 1 | 0 |
| C = 1 (NOR): | | |
| 0 | 0 | 1 |
| 0 | 1 | 0 |
| 1 | 0 | 0 |
| 1 | 1 | 0 |

FIGS. 8a–d depict a preferred embodiment of the programmable inverters 86a–d of FIG. 6. The following discussion applies to any one of the inverters 86a–d, and its respective inputs and outputs. This preferred approach includes an XNOR gate 86 having an input connected to node E, another input connected to a control node C and an output connected to node M. If C=0, an inverted version of the signal at node E is present at node M, and if C=1, a non-inverted version of the signal at E is present at node M.

In contrast to the multiplexer approach generally depicted in FIG. 6, the inverter approach with reference to FIGS. 8a–d provides a buffered signal in both the inverted path and non-inverted path. With a buffered signal, better rise/fall time is provided. This is especially important if the rise/fall time of the input signals are already affected by pass gates used in multiplexers 78a–d, shown in FIG. 6. Another advantage of this approach is a better timing balance between the inverted and the non-inverted signal paths.

Figure 8A:
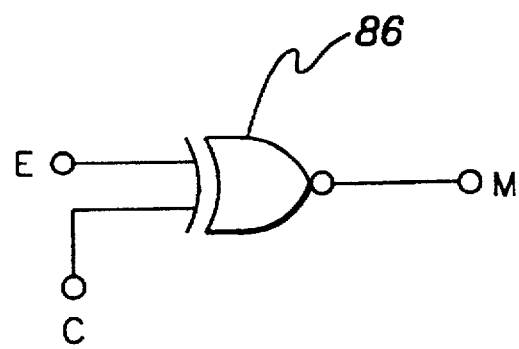
FIGS. 8a-8d depict a logic diagram and schematics of the programmable input inverter employed in the programmable logic cell pursuant to the principles of the present invention.
Figure 8B:
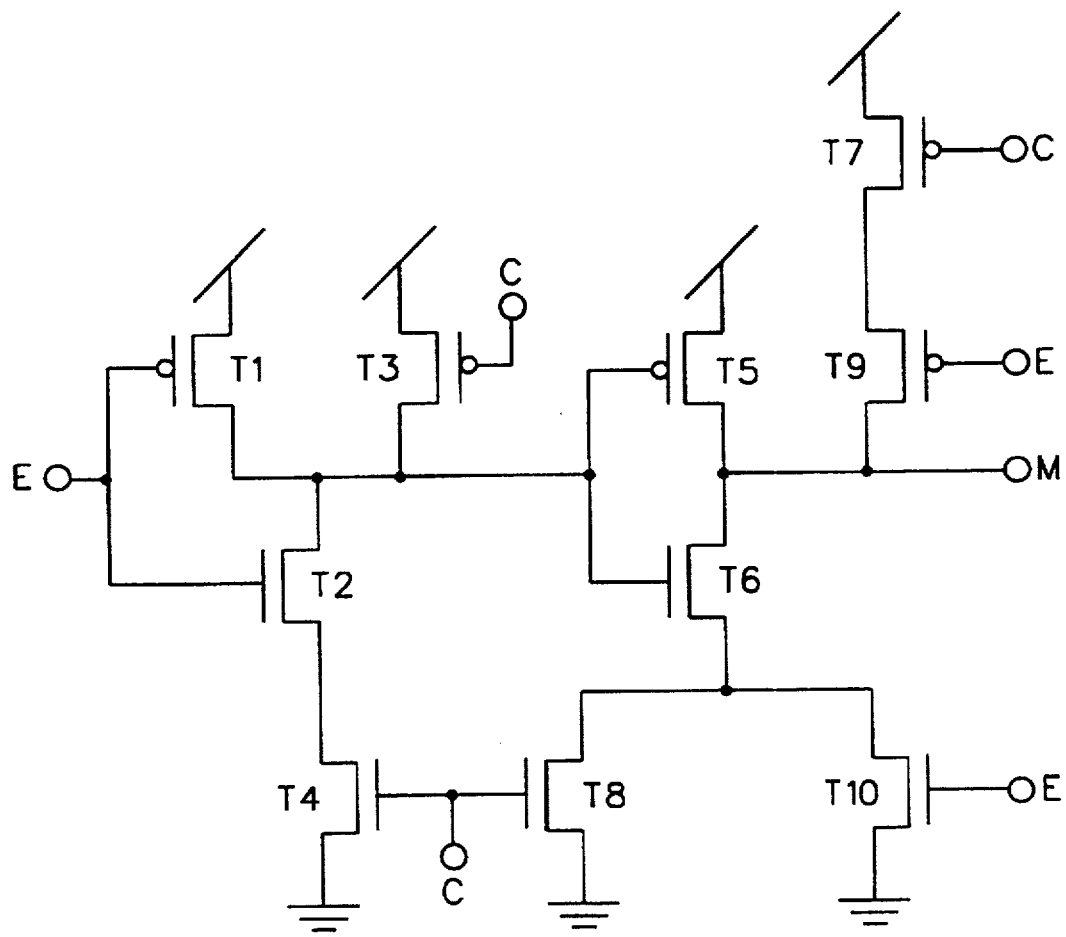
Figure 8C:
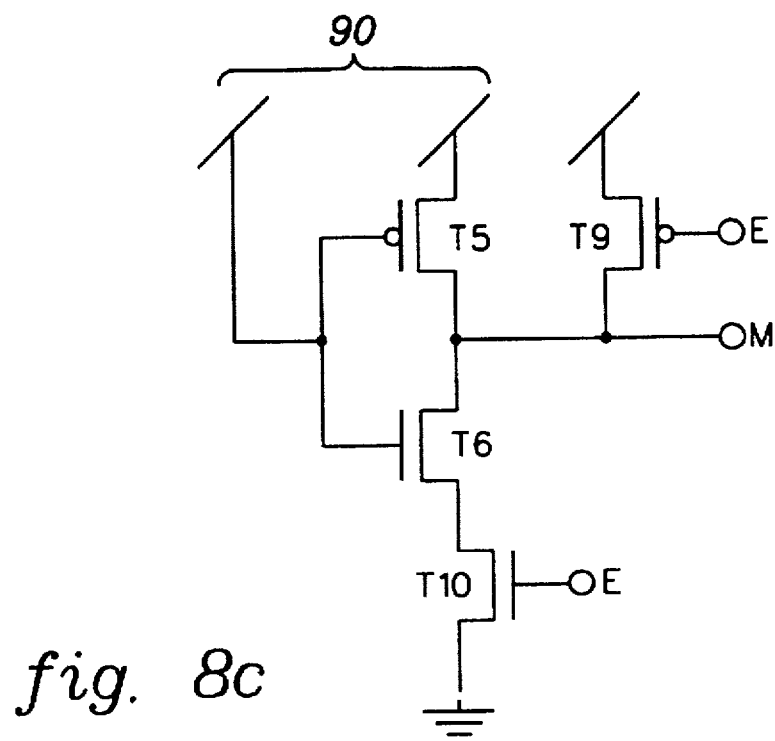

FIG. 8b is a schematic of the inverter XNOR gate and comprises p-channel transistors T1, T3, T5, T7 and T9; and n-channel transistors T2, T4, T6, T8 and T10. FIG. 8c depicts the resultant circuit when the control signal C is set at logic "0." Inverter 90, having its input tied to the voltage supply, provides a low logic "0" state to node M if the inputs at node E are logic "1." Transistor T9 provides a logic "1" to node M if node E is set to logic "0." Note that the delay encountered is approximately the turn on delay of either transistor T9 or T10, and that the output signal is re-driven.

Figure 8D:
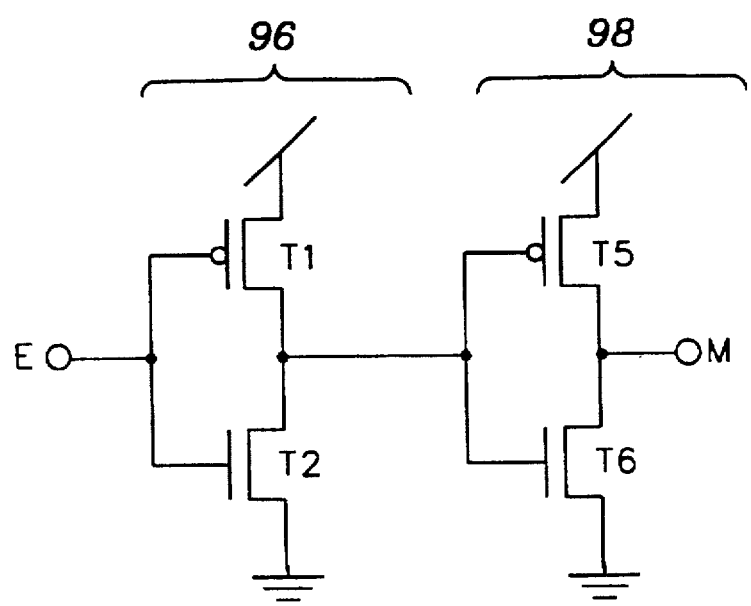

FIG. 8d depicts the configuration of the inverter circuit when control signal C is set at logic "1." In this case, the circuit merely comprises inverters 96 and 98. The output signal M merely represents a re-driven version of the input signal E, and the delay encountered is dependent on the turn on times of transistors T1, T2, T5 and T6.

Figure 9:
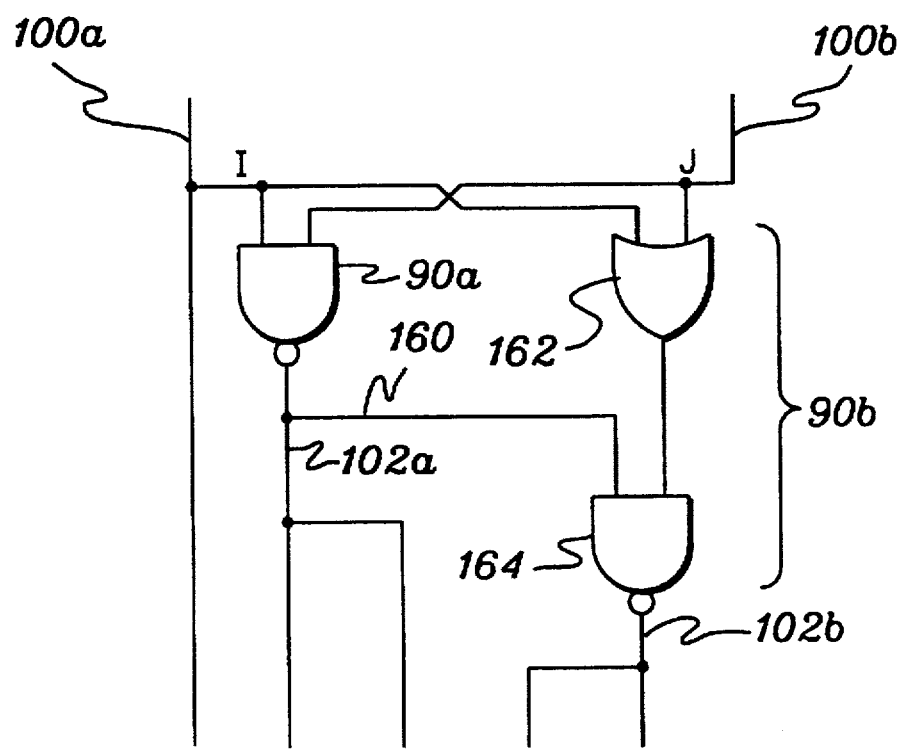
FIG. 9 depicts a preferred embodiment of the arrangement of fixed logic gates in the logic cell of the present invention.

FIG. 9 (in which like elements are indicted with like reference numerals) depicts a preferred embodiment of the fixed logic gates 90a and 90b of FIG. 6. XNOR gate 90b can be implemented using a combination of OR gate 162 and NAND gate 164. An output of NAND gate 90a is used as an input to NAND gate 164. Gates 162 and 164 can be implemented in a circuit using a combination of well-known CMOS OR and NAND components.

As discussed above, various technologies are known to those skilled in the art to provide array programmability. Any of these techniques, or variants thereof, can be used to program the logic cell of the present invention. Mask programming techniques include customizing the deposition of the final layers of metallization of an otherwise generally designed integrated circuit (see, for example, U.S. Pat. No. 3,993,919 to Cox et al. entitled "PROGRAMMABLE LATCH AND OTHER CIRCUITS FOR LOGIC ARRAYS," Nov. 23, 1976; and U.S. Pat. No. 4,742,383 to Fitzgerald entitled "MULTI-FUNCTION FET MASTER-SLICE CELL," May 3, 1988; both patents assigned to the same assignee as the present application). Laser programming techniques involve customizing the metallization layers following their deposition (see, for example, Raffel et al., "A WAFER-SCALE DIGITAL INTEGRATOR USING RESTRUCTURABLE VSLI," IEEE Journal of Solid-State Circuits, Vol. SC-20, No. 1, February 1985, at pg. 399). Fusible links or antifuses can be employed and offer permanent (non-volatile) programming (see, for example, Millman, "MICROELECTRONICS," McGraw-Hill, Inc., 1979, at pg. 196; and U.S. Pat. No. 4,758,745 to Elgamal et al. entitled "USER PROGRAMMABLE INTEGRATED CIRCUIT INTERCONNECT ARCHITECTURE AND TEST METHOD," Jul. 19, 1988). Erasable programmable read only memory ("EPROM") and electrically erasable programmable read only memory ("EPROM") devices can be used and offer semi-permanent programming. EPROMS and EEPROMS are both electrically programmable and hold their states, even if power is removed. Special erase procedures can be used, however, to reconfigure the devices (see, for example, Wood et al., "AN ELECTRICALLY ALTERABLE PLA FOR FAST TURNAROUND TIME VLSI DEVELOPMENT HARDWARE," IEEE Journal of Solid-State Circuits, Vol. SC-16, No. 5, October 1981, at pg. 570). Finally, volatile random access memory ("RAM") devices are also available which are fully programmable and reprogrammable, but which lose their programmed state if power is removed (see, for example, U.S. Pat. No. 4,177,452 to Balasubramanian et al., Dec. 4, 1979, assigned to the same assignee as the present application). These and other techniques for programming arrays are known to those in the art and are also generally described in the publication entitled "FIELD-PROGRAMMABLE GATE ARRAYS" by S. Brown, R. Francis, J. Rose and Z. Vranesic, Kluwer Academic Publishers, 1992. Each of the above-named sources is hereby incorporated herein by reference in its entirety.

Figure 10:
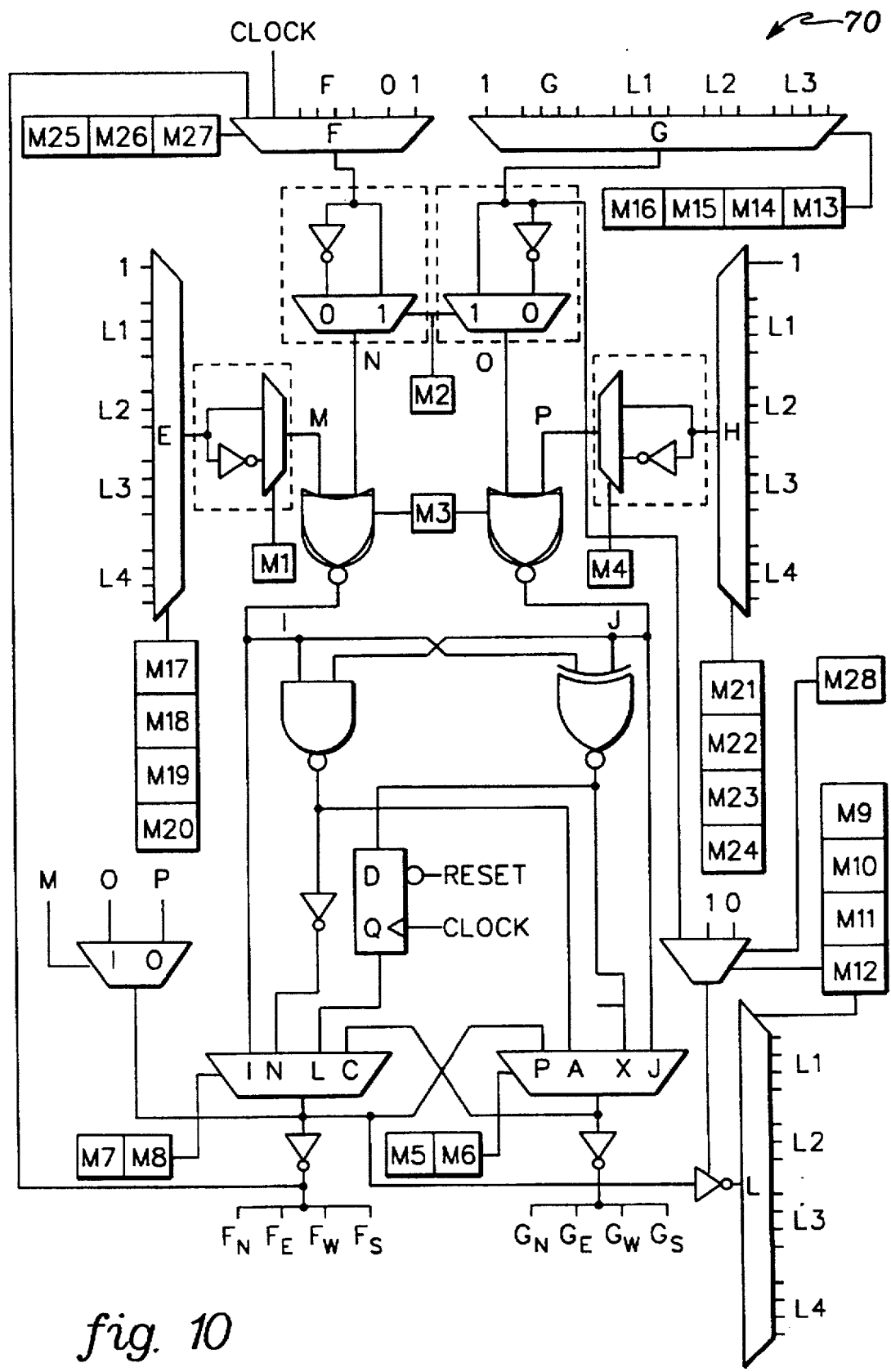
FIG. 10 depicts the location of configuration memory cells Mnn in the logic cell of FIG. 6.

As discussed above, the preferred approach for programming the logic cell of the present invention involves SRAM memory cells, programmed by a user. FIG. 10 depicts preferred connections for SRAM cells M1–28 of the logic cell of FIG. 6. The array can be configured in accordance with the techniques disclosed in the publication entitled "APPLICATION NOTE AT6000 SERIES CONFIGURATION", May 1993, Revision 1B, Atmel Corporation, which is hereby incorporated by reference in its entirety.

Note that inverters at nodes N and O can be commonly controlled by a single memory cell M2. Note also that the programmable logic gates are controlled by a single memory cell M3. In each case, each resource (inverter or gate) of tid pair is controlled identically by the shared memory cell.

Figure 11:
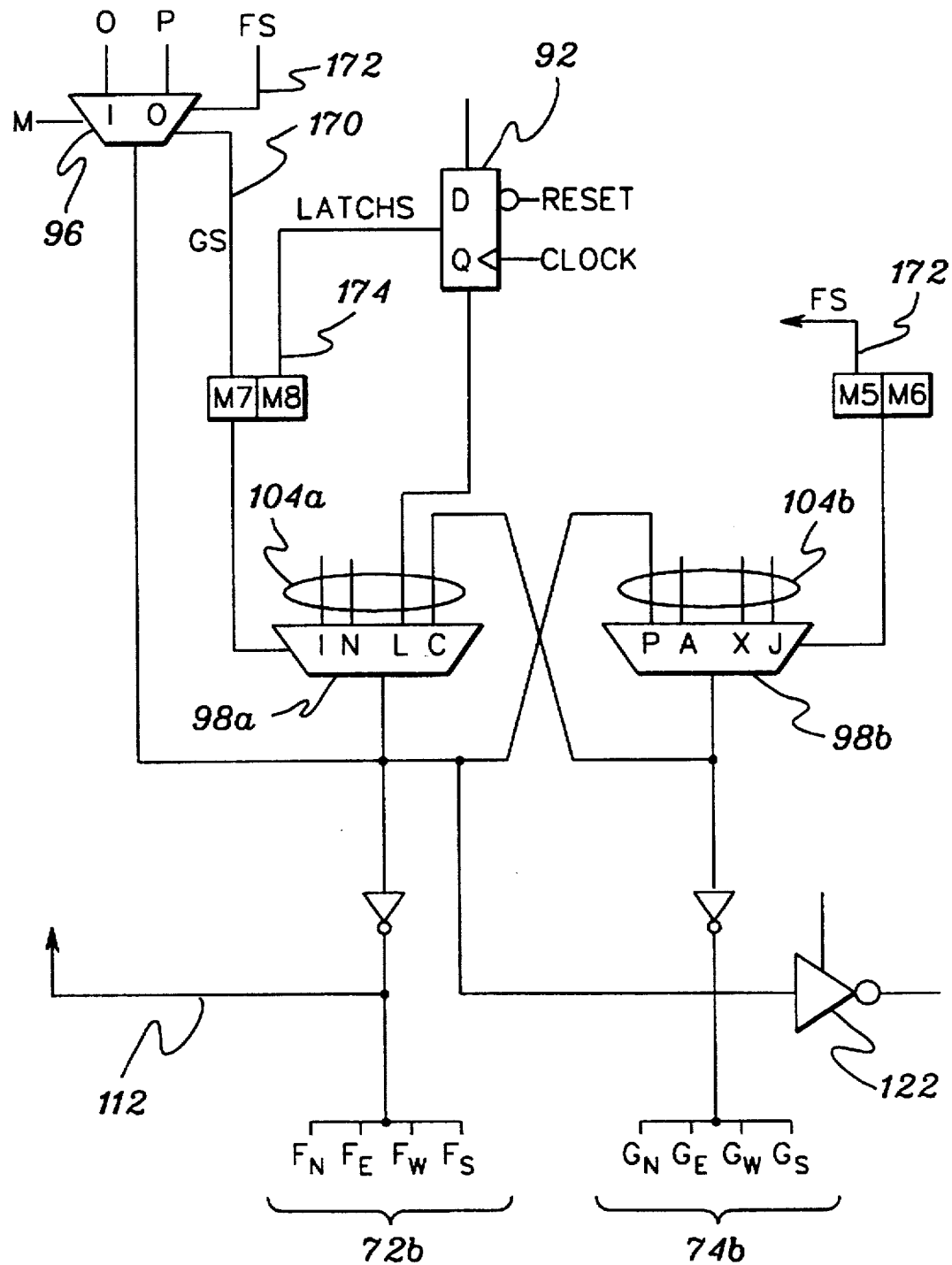
FIG. 11 depicts additional detail regarding the use of the configuration memory cells in the logic cell of FIG. 6.
Figure 12:
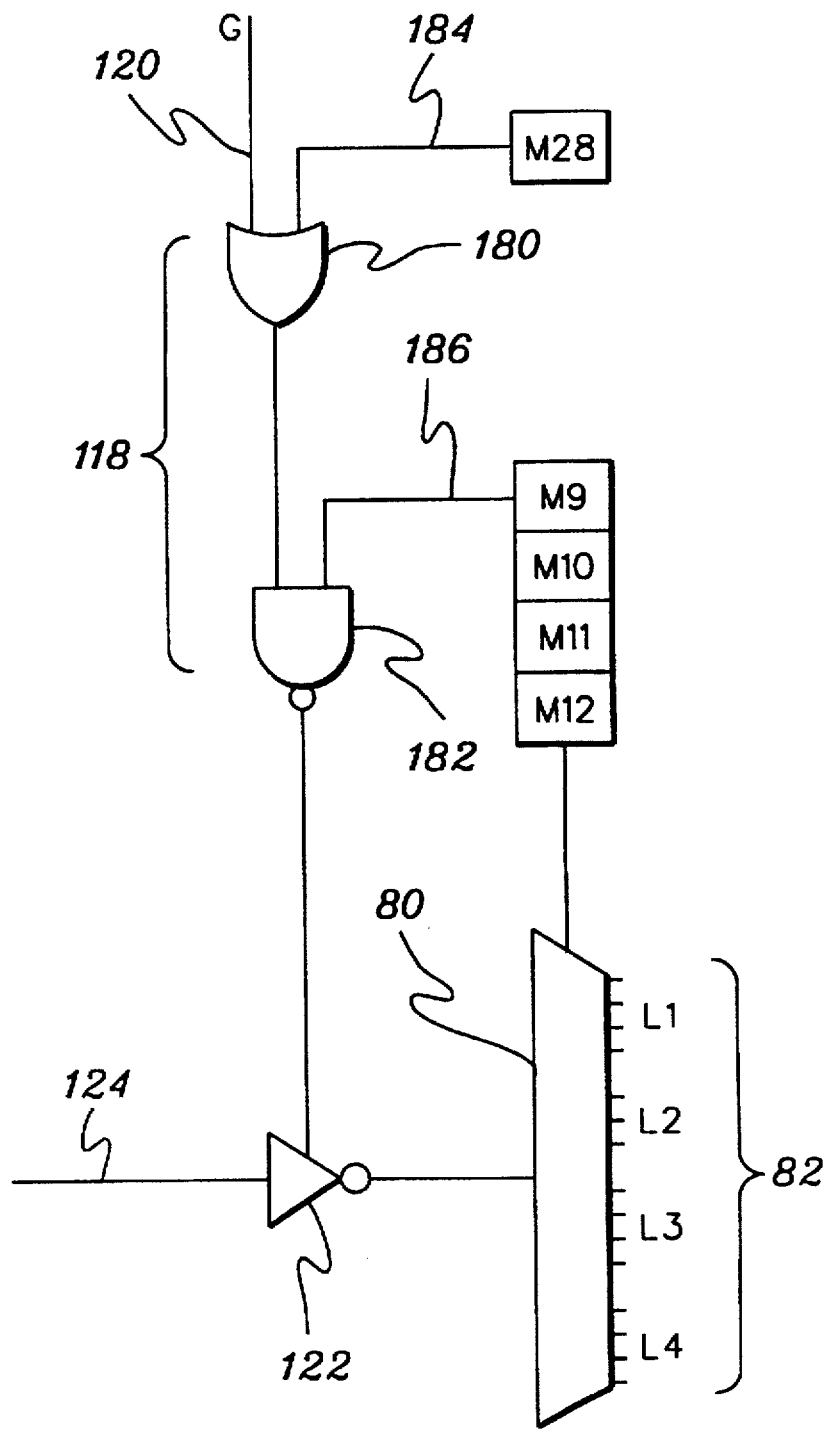
FIG. 12 depicts additional detail regarding the tri-state buffer control in the logic cell of FIG. 6.

FIGS. 11–12 (in which like elements are indicated with like reference numerals) depict additional detail of the control of certain portions of the logic cell of FIG. 6. In FIG. 11, memory cells M7 and M8 control the four possible states of multiplexer 98a. The decoded state LatchS is routed on line 174 to flip-flop 92 to gate the clock. If the flip-flop output is not being routed through multiplexer 98a (i.e., the flip-flop is not in use), the LatchS signal gates the clock off so that the devices connected to the clock network are not unnecessarily switching and thereby wasting power.

Also, because memory cells M5–M8 together control the states of multiplexers 98a and 98b, and because of the cross-coupling of these multiplexers (discussed above), only 15 of the 16 usable states of memory cells M5–M8 are used to control multiplexers 98a and 98b. The state defining a fully cross-coupled configuration is meaningless. This remaining state uses the GS 170 and FS 172 lines to gate the output of cell multiplexer 96.

FIG. 12 (in which like elements are indicated with like reference numerals) depicts an embodiment of multiplexer 118 of FIG. 6 comprising OR gate 180 and NAND gate 182. Because multiplexer 80 contains only 15 configurations, the extra state of control cells M9–M12 is applied to multiplexer 118 using line 186. Both states of cell M28 are applied to multiplexer 118 on line 184. If none of the 15 outputs 82 is selected, tri-state buffer 122 is placed in a high impedance mode with decoded state 186 ("0"). If M28="1, " then tri-state buffer 122 is on and applies the signal from line 124 to the multiplexer 80. If M28="0," tri-state buffer 122 is controlled by the cell signal G on line 120.

The programmable logic cell disclosed above is designed to provide a rich fixed library equally well-suited for both structured and random logic designs. Because the cell is much closer to a standard gate array cell than many other available programmable logic cells, it is much easier to synthesize a design using this logic cell. The programmable logic cell disclosed above has four inputs and three outputs, each with its own multiplexer to select signal origin or destination. Two of the input multiplexers (E and H) can select from any one of the local buses for input. The F input multiplexer can select a signal from the direct interconnect conductors, or the column clock. The G input multiplexer can select a signal from either the local buses or the direct interconnect conductors. The output multiplexer L connects to any one of the local buses, and the two groups of direct connect outputs can directly connect to any of the adjacent cells.

The logic within the cell is designed to generate any function of three inputs and the most useful functions of four inputs. Each input can be inverted or not as it comes into the cell. The signals are paired and go through a logic gate which can provide a selectable NAND or NOR function. The results at nodes I and J are then sent through several functions which the user then selects through the output multiplexers. The F output and the G output are selected independently allowing two unique functions to be generated from the cell. Also, the function available at the F and G outputs can be switched within the core cell which eases routing problems when a high number of direct interconnects are used.

The quantity of cells provided within the array results in an architecture which supports many logic functions and flip-flops. To increase the utilization of each cell, an internal feedback path is provided to the F input allowing functions requiring feedback to be generated within a single cell. A clock input is provided to the F input multiplexer which allows clock gating or generation of a global clock with any function that the programmable logic cell supports. Table 1 contains a listing of the programmable functions in an embodiment of a field programmable gate array using the programmable logic cell disclosed above in FIG. 6. The number of functions available (145) far exceeds those available with prior standard cell approaches. In addition, the functions were selected to comprise the most used functions of the many available within a LUT cell. Thus, the programmable logic cell disclosed herein provides much of the functionality of a LUT, but uses standard cell technology.

TABLE 1

| NAME | DESCRIPTION | FUNCTION |
|---|---|---|
| ONE | Logic ONE | Q = 1 |
| ZERO | Logic ZERO | Q = 0 |
| BUF | BUFFER | Q = a |
| INV | INVERTER | Q = a' |
| AN2 | 2 input AND | Q = ab |
| AN2C1 | 2 input AND with 1 complemented input | Q = ab' |
| AN2C12Q | 2 in 2 out AND, 1 input+1 output inv. | Q1 = ab',Q2 = a'+b |
| AN2Q21 | 2 in 2 out AND, 1 output inverted | Q0 = ab, Q2 = a'+b' |
| ANINV | 2 input AND, output2 is inverted input | Q0 = ab, Q2 = b |
| AN3 | 3 Input AND | Q = abc |
| AN3C1 | 3 input AND with 1 complemented input | Q = abc' |
| AN3C2 | 3 input AND with 2 complemented inputs | Q = ab'c' |
| AN4 | 4 input AND | Q = abcd |
| AN4C1 | 4 input AND with 1 complemented input | Q = abcd' |
| AN4C2 | 4 Input AND with 2 complemented input | Q = abc'd' |
| ND2 | 2 input NAND | Q = a'+b' |
| NDND | Twin 2 input NANDs | Q1 = a'+b',Q2 = a'+b' |
| ND2C1 | 2 input NAND with 1 complemented input | Q = a'+b |
| ND3 | 3 input NAND | Q = a'+b'+c' |
| ND3C1 | 3 input NAND with 1 complemented input | Q = a'+b'+c |
| ND3C2 | 3 input NAND with 2 complemented inputs | Q = a'+b+c |
| ND4 | 4 input NAND | Q = a'+b'+c'+d' |
| ND4C1 | 4 input NAND with 1 complemented input | Q = a'+b'+c'+d |
| OR2 | 2 input OR | Q = a+b |
| OR2C1 | 2 input OR with 1 complemented input | Q = a'+b |
| OR3 | 3 input OR | Q = a+b+c |
| OR3C1 | 3 input OR with 1 complemented input | Q = a+b+c' |
| OR4 | 4 input OR | Q = a+b+c+d |
| OR4C1 | 4 input OR with 1 complemented input | Q = a+b+c+d' |
| OR4C2 | 4 input OR with 2 complemented input | Q = a+b+c'+d' |
| NO2 | 2 input NOR | Q = a'.b' |
| NO22Q | 2 input NOR with 2 outputs | Q1 = a'.b', Q2 = a+b |
| NO2C1 | 2 input NOR with t 1 complemented input | Q = a.b' |
| NO3 | 3 input NOR | Q = a'.b'.c' |
| NO3C1 | 3 input NOR with 1 complemented input | Q = a'.b'.c |
| NO4 | 4 input NOR | Q = a'.b'.c'.d' |
| NO4C1 | 4 input NOR with 1 complemented input | Q = a'.b'.c'.d |
| XO2 | 2 input XOR | Q = ab'+a'b |
| XNO2 | 2 input XNOR | Q = a'b'+ab |
| MUXP | 2 to 1 MUX (fast) | Q = as+bs' |
| MUX2 | 2 to 1 MUX | Q = as+bs' |
| MUX2XO (*) | 2 to 1 MUX (using XOR) | Q = as+bs' |
| MUXC0 | 2 to 1 MUX, 0 input complemented | Q = as+b's' |
| MUXC1 | 2 to 1 MUX, 1 input complemented | Q = a's+bs' |
| MUXI | 2 to 1 MUX, output inverted (fast) | Q = a's+b's' |
| MUX2I | 2 to 1 MUX, output inverted | Q = a's+b's' |
| MUXF | 2 to 1 MUX with Q and QN outputs | Q = as+bs' |
| MUXFB0 | 2-1 MUX with Feedback to 0, and Q/QN | Q1 = qs+bs', Q2=(qs+bs')' |
| MUXFB1 | 2-1 MUX with Feedback to 1, and Q/QN | Q1 = qs+bs', Q2=(qs+bs')' |
| AO21 | AND-OR 2-1 inputs | Q = ab+c |
| AO121 | AND-OR Inverter, 2-1 inputs | Q = a'c'+b'c' |
| AO21C01 | AND-OR 2-1(complemented) inputs | Q = ab+c' |
| AO121C0 | AND-NOR 2-1(complemented) inputs | Q = a'c+b'c |
| AO21C1 | AND-OR 2 (1 complemented) -1 inputs | Q = ab'+c |
| AO121C1 | AND-NOR 2 (1 complemented) -1 inputs | Q = a'c'+bc' |
| AO22 | AND-OR 2-2 inputs | Q = ab+cd |
| AO22C01 | AND-OR 2-2 (1 complemented) inputs | Q = ab+cd' |
| AO22C11 | AND-OR 2(1 compl.)-2(1 compl.) inputs | Q = ab'+cd' |
| AO122 | AND-NOR 2-2 inputs | Q = a'c'+a'd'+b'c'+b'd' |
| AO122C0 | AND-NOR 2-2 (1 complemented) inputs | Q = a'c'+a'd+b'c'+b'd |
| AX21 | AND-XOR 2-1 inputs | Q = a'c+b'c+abc' |
| AX212Q | AND-XOR 2-1 inputs, AND & XOR 2 outputs | Q1 = a'c+b'c+abc', Q2=ab |
| AXN21 | AND-XNOR, 2-1 inputs | Q = a'c'+b'c'+abc |
| AX21C1 | AND-XOR 2 (1 complemented) -1 inputs | Q = a'c+bc+ab'c' |
| AXN21C1 | AND-XNOR 2 (1 complemented) -1 inputs | Q = a'c'+bc'+ab'c |
| AX22 | AND-XOR 2-2 inputs | Q = abc'+abd'+a'cd+b'cd |
| AX22C01 | AND-XOR 2-2 (1 complemented) inputs | Q = abc'+abd+a'cd'+b'cd' |
| AX22C11 | AND-XOR 2(1 compl.)-2(1 compl.) inputs | Q = ab'c'+ab'd+a'cd'+bcd' |
| OA21 | OR-AND 2-1 inputs | Q = ac+bc |
| OAI21 | OR-NAND 2-1 inputs | Q =a'b'+c' |
| OA21C01 | OR-AND 2-1(complemented) inputs | Q = ac'+bc' |
| OA121C0 | OR-NAND 2-1(complemented) inputs | Q = a'b'+c |
| OA21C1 | OR-AND 2 (1 complemented) -1 inputs | Q = ac+b'c |
| OA121C1 | OR-NAND 2 (1 complemented) -1 inputs | Q = a'b+c' |
| OA22 | OR-AND 2-2 inputs | Q = ac+ad+bc+bd |
| OA22C01 | OR-AND 2-2 (1 complemented) inputs | Q = ac+ad'+bc+bd' |
| OA22C11 | OR-AND 2(1 compl.)-2(1 compl.) inputs | Q = ac+ad'+b'c+b'd' |
| OA122 | OR-NAND 2-2 inputs | Q = a'b'+c'd' |
| OA122C0 | OR-NAND 2-2 (1 complemented) inputs | Q = a'b'+c'd |
| OX21 | OR-XOR 2-1 inputs | Q = ac'+bc'+a'b'c |
| OXN21 | OR-XNOR, 2-1 inputs | Q = ac+bc+a'b'c' |
| OX22 | OR-XOR 2-2 inputs | Q = ac'd'+bc'd'+a'b'c+a'b'd |
| OX22C01 | OR-XOR 2-2 (1 complemented) inputs | Q = ac'd+bc'd+a'b'c+a'b'd' |
| XOND | 2 input XOR & NAND with 2 outputs | Q1= (ab)' & Q2= a⊕b |
| XOND3 | 2 input XOR, 3-input NAND, 2 outputs | Q1= (abc)' & Q2= (ab)Ec |
| HAL1 | 1-Bit Half Adder Carry Low | |

TRI-STATE:

| | | |
|---|---|---|
| LZ | Bus Driver Low or Z | |
| HZ | Bus Driver High or Z | |
| BUFZ | Tri-state Buffer | |
| BUFZ2 | Tri-state Buffer and another Buffer Output | |
| INVZ | Tri-state Inverter | |
| FDZQ | D Flip-Flop with Tri-State Out | |
| FDZQ2 | D Flip-Flop with Tri-state Out and Q Out | |

FLIP-FLOPS:

| | | |
|---|---|---|
| LD | D Latch Transparent High | |
| LDL | D Latch Transparent Low | |
| FD | D Flip-Flop Synchronous | |
| FD2 | D Flip-Flop with Q1=d; Q2=d' | |
| FDE | D Flip-Flop Synchronous with Enable | |
| FDEL | D Flip-Flop Synchronous with Enable low | |
| FDHA | D Flip-Flop Half Adder Sum | |
| FDHAFB | D Flip-Flop Half Adder Sum with a Feedback | |
| CR0 | 0-Bit Ripple-Carry Counter | |

TABLE 1-continued

| | |
|---|---|
| CR1 | 1-Bit Ripple-Carry Counter |
| CRST | Bit Stage Ripple-Carry Counter |
| FDMUX (*) | D Flip-Flop with a MUX input |
| FDMUXFB0(*)D | Flip-Flop with a Feedback to MUX 0-input |
| FDMUXFB1(*)D | Flip-Flop with a Feedback to MUX 1-input |
| PSC1 | 1-Bit Parallel-to-Serial Converter |
| SRPST | Bit Stage Shift Register w/Parallel Load |
| FAN2C1 | D Flip-Flop, Input AN2C1 |
| FAX21C1 | D Flip-Flop, Input AX21C1 (pins swapped) |
| FAX22C1 | D Flip-Flop, Input AX22C1 |
| FAX22C2 | D Flip-Flop, Input AX22C11 |
| FAXN21 | D Flip-Flop, Input AXN21 (pins swapped) |
| FAXN21C | D Flip-Flop, Input AXN21C (pins swapped) |
| FDN | D Flip-Flop Synchronous with QN Out |
| FDNAND | D Flip-Flop 2 Input NAND |
| FND2C1 | D Flip-Flop, Input ND2C1 |
| FDNFB | D Flip-Flop Feedback Synchronous with QN Out |
| FDN2 | D Flip-Flop, Q1=inverted D; Q2=Inverted input |
| FDAN | D Flip-Flop 2 input AND |
| FDND | D Flip-Flop with D=(ab)'& ab second output |
| FDOR | D Flip-Flop 2 Input OR |
| FDORN | D Flip-Flop Input (a+b') |
| FNOR | D Flop-Flop Input NO2 |
| FDX | D Flip-Flop 2 Input XOR |
| FXNO | D Flip-Flop, input NO2 |
| FDXFB | D Flip-Flop Input XOR with a Feedback |
| FDAX | D Flip-Flop Input AX22 |
| FDAXF | D Flip-Flop 2 input AND & XOR |
| FDAXFB | D Flip-Flop Input AND with a Feedback & XOR |
| FDX3AN | D Flip-Flop with Q1=(ab)XOR(c); Q2=(a*b)AND(c) |
| FDOX | D Flip-Flop, Input OX22 |
| FOX21 | D Flip-Flop, Input OX21 (pins swapped) |
| FOXN21 | D Flip-Flop, Input OXN21 (pins swapped) |
| FX22C01 | D Flip-Flop, Input OX22C01 |
| FDOXF | D Flip-Flop, Input (a)XOR(b'c) Input |
| FDOXFB | D Flip-Flop, Input OR with a Feedback & XOR |
| FDR | D Flip Flop Synchronous Reset Low |
| FDS | D Flip-Flop Synchronous Set Low |
| FT | T Flip-Flop Synchronous |
| FTR | T Flip-Flop Synchronous Reset Low |
| FTRA | T Flip-Flop Asynchronous Reset Low |
| FTS | T Flip-Flop Synchronlus Set Low |
| CLKEDGE | Clock Edge Detect |

Table 2 contains the memory cell settings necessary to program the cell for the functions of Table 1. The settings of memory cells M1–M8, and M25–27, depicted in FIG. 10, are shown in Table 2 in accordance with the following keys (which contain references to the programmable resources in FIG. 6 and FIG. 10). Memory cells M9–M24, and M28, are not contained in the table as they may vary highly depending only on a user's chosen input signal sources and output signal destinations. Table 2, in many instances, contains alternate memory cell settings for a single function set forth in Table 1.

| M1, | M2, | M4 | Inverters 86 |
|---|---|---|---|
| 0 | | | Inverted |
| 1 | | | Non-inverted |
| M3 | | | NAND/NOR Gates |
| 0 | | | NAND |
| 1 | | | NOR |
| M6 | M5 | | G Output Selection (Multiplexer 98b) |
| 0 | 0 | | J |
| 0 | 1 | | X |
| 1 | 0 | | A |
| 1 | 1 | | P |
| M8 | M7 | | F Output Selection (Multiplexer 98a) |
| 0 | 0 | | I |
| 0 | 1 | | N |
| 1 | 0 | | L |
| 1 | 1 | | C |
| M27 | M26 | M25 | F Input Selection (Multiplexer 78b) |
| 0 | 0 | 0 | 1 (Vdd) |
| 0 | 0 | 1 | Fin South |
| 0 | 1 | 0 | 0 (Ground) |
| 0 | 1 | 1 | Fin North |
| 1 | 0 | 0 | Sector Clock |
| 1 | 0 | 1 | Fin West |
| 1 | 1 | 0 | Feedback |
| 1 | 1 | 1 | Fin East |

Each entry of Table 2 is arranged as follows:

FUNCTION   M27 M26 M25   M8 M7 M6 M5 M4 M3 M2 M1

TABLE 2

| | | | |
|---|---|---|---|
| ONE_2 | 000 00001010 | INV_4 | 000 00000001 |
| ONE_1 | 000 00000011 | INV_3 | 000 00000010 |
| ZERO_2 | 000 00001000 | INV_2 | 000 00001000 |
| ZERO_1 | 000 00000001 | INV_1 | 000 00000010 |
| BUF_4 | 000 00000011 | AN2_5 | 010 00101000 |
| BUF_3 | 000 00001010 | AN2_4 | 000 00101001 |
| BUF_2 | 000 00001010 | AN2_3 | 000 00000011 |
| BUF_1 | 000 00000011 | AN2_2 | 000 00100010 |
| AN2_1 | 000 00001010 | ND2C1_3 | 000 00000110 |
| AN2C1_8 | 000 00101010 | ND2C1_2 | 000 00000110 |
| AN2C1_7 | 010 00101001 | ND2C1_1 | 000 00001100 |
| AN2C1_6 | 000 00000010 | OR2C1_4 | 000 00000101 |
| AN2C1_5 | 000 00000001 | OR2C1_3 | 000 00000110 |
| AN2C1_4 | 000 00101010 | OR2C1_2 | 000 00000110 |
| AN2C1_3 | 000 00100011 | OR2C1_1 | 000 00001100 |
| AN2C1_2 | 000 00001000 | ND3_4 | 000 01000100 |
| AN2C1_1 | 000 00000010 | ND3_3 | 000 01000100 |
| NO2C1_8 | 000 00101010 | ND3_2 | 000 01000100 |
| NO2C1_7 | 010 00101001 | ND3_1 | 000 01000100 |
| NO2C1_6 | 000 00000010 | OR3C3_4 | 000 01000100 |
| NO2C1_5 | 000 00000001 | OR3C3_3 | 000 01000100 |
| NO2C1_4 | 000 00101010 | OR3C3_2 | 000 01000100 |
| NO2C1_3 | 000 00100011 | OR3C3_1 | 000 01000100 |
| NO2C1_2 | 000 00001000 | ND3C1_4 | 000 01001100 |
| NO2C1_1 | 000 00000010 | ND3C1_3 | 000 01001100 |
| AN2Q2L_3 | 000 01101001 | ND3C1_2 | 010 01000110 |
| AN2Q2L_2 | 000 01100011 | ND3C1_1 | 000 01000101 |
| AN2Q2L_1 | 010 01101011 | OR3C2_4 | 000 01001100 |
| AN3_4 | 000 00100100 | OR3C2_3 | 000 01001100 |
| AN3_3 | 000 00100100 | OR3C2_2 | 010 01000110 |
| AN3_2 | 000 00100100 | OR3C2_1 | 000 01000101 |
| AN3_1 | 000 00100100 | ND4_1 | 000 01000100 |
| AN3C1_5 | 000 00101100 | OR4C4_1 | 000 01000100 |
| AN3C1_4 | 000 00100101 | ND4C1_2 | 000 01000101 |
| AN3C1_3 | 000 00101100 | ND4C1_1 | 000 01001100 |
| AN3C1_2 | 010 00100110 | OR4C3_2 | 000 01000101 |
| AN3C1_1 | 000 00100101 | OR4C3_1 | 000 01001100 |
| ND3C2_3 | 000 00100110 | OR2_4 | 000 01001011 |
| ND3C2_2 | 000 01001101 | OR2_3 | 000 01001011 |
| ND3C2_1 | 000 01001101 | OR2_2 | 000 00000111 |
| AN3C2_3 | 000 00100110 | OR2_1 | 000 00001110 |
| AN3C2_2 | 000 00101101 | OR3_3 | 000 00001110 |
| AN3C2_1 | 000 00101101 | OR3_2 | 000 01000111 |
| AN4_1 | 000 00100100 | OR3_1 | 010 01001111 |
| AN4C1_2 | 000 00100101 | OR3C1_4 | 000 01001110 |
| AN4C1_1 | 000 00101100 | OR3C1_3 | 010 01001110 |
| AN4C2_1 | 000 00100110 | OR3C1_2 | 010 01001101 |
| ND2_4 | 010 01001000 | OR3C1_1 | 010 01000111 |
| ND2_3 | 000 01001001 | OR4_1 | 000 01001111 |
| ND2_2 | 000 00000100 | OR4C1_2 | 000 01001110 |
| ND2_1 | 000 00000100 | OR4C1_1 | 000 01000111 |
| OR2C2_4 | 010 01001000 | OR4C2_2 | 000 01001101 |
| OR2C2_3 | 000 01001001 | OR4C2_1 | 000 01000110 |
| OR2C2_2 | 000 00000100 | NO2_4 | 000 00101011 |

TABLE 2-continued

| Name | Bits | Name | Bits |
|---|---|---|---|
| OR2C2_1 | 000 00000100 | NO2_3 | 000 00101011 |
| ND2C1_4 | 000 00000101 | NO2_2 | 000 00000000 |
| NO2_1 | 000 00000000 | AO21_2 | 000 01001011 |
| AN2C2_4 | 000 00101011 | AO21_1 | 000 01001011 |
| AN2C2_3 | 000 00101011 | AO121_3 | 000 00101011 |
| AN2C2_2 | 000 00000000 | AO121_2 | 000 00101011 |
| AN2C2_1 | 000 00000000 | AO121_1 | 000 00101011 |
| NO3_3 | 000 00101110 | AO21C01_2 | 000 01000011 |
| NO3_2 | 000 00100111 | AO21C01_1 | 000 01001010 |
| NO3_1 | 010 00101111 | AO121C0_2 | 000 00100011 |
| AN3C3_3 | 000 00101111 | AOI21C0_1 | 000 00101010 |
| AN3C3_2 | 000 00100111 | AO1C1_3 | 000 01000011 |
| AN3C3_1 | 010 00101111 | AO21C1_2 | 000 00100011 |
| NO3C1_4 | 000 00100110 | AO21C1_1 | 010 01001001 |
| NO3C1_3 | 010 00101110 | AOI21C1_4 | 000 00101010 |
| NO3C1_2 | 000 00101101 | AOI21C1_3 | 000 00100011 |
| NO3C1_1 | 010 00100111 | AOI21C1_2 | 000 00100011 |
| NO4_1 | 000 00101111 | AO121C1_1 | 010 00101001 |
| AN4C4_1 | 000 00101111 | AO22_1 | 000 01001011 |
| NO4C1_2 | 000 00101110 | AO22C01_2 | 000 01000011 |
| NO4C1_1 | 000 00100111 | AO22C01_1 | 000 01001010 |
| AN4C3_2 | 000 00101110 | AO22C11_2 | 000 01000010 |
| AN4C3_1 | 000 00100111 | AO22C11_1 | 000 01001011 |
| XO2_4 | 000 00011011 | AOI22_1 | 000 00101011 |
| XO2_3 | 000 00011011 | AO122C0_2 | 000 00101010 |
| XO2_2 | 000 00011011 | AO122C0_1 | 000 00100011 |
| XO2_1 | 000 00011011 | AX21_3 | 000 00011011 |
| XNO2_3 | 000 00010011 | AX21_2 | 000 00011011 |
| XNO2_2 | 000 00010011 | AX21_1 | 000 00011011 |
| XNO2_1 | 010 00011001 | AX212Q_2 | 000 00011011 |
| MUXF_2 | 000 01101010 | AX212Q_1 | 000 00011011 |
| MUXF_1 | 000 01100011 | AXN21_2 | 000 00011011 |
| MUXFB1_1 | 110 01100011 | AXN21_1 | 000 00011010 |
| MUXFB0_1 | 110 01101010 | AX21C1_4 | 000 00011010 |
| MUX2_2 | 000 01000011 | AX21C1_3 | 000 00010011 |
| MUX2_1 | 000 01001010 | AX21C1_2 | 010 00011001 |
| MUXP_2 | 000 11110000 | AX21C1_1 | 000 00010011 |
| MUXP_1 | 000 11110001 | AXN21C1_4 | 000 00011001 |
| MUXC1_2 | 000 11111000 | AXN21C1_3 | 000 00011001 |
| MUXC1_1 | 000 11111101 | AXN21C1_2 | 010 00011000 |
| MUXC0_2 | 000 11110010 | ANXN21C1_1 | 000 00010010 |
| MUXC0_1 | 000 11111001 | AX22_1 | 000 00011011 |
| MUXL_2 | 000 11111010 | AX22C01_2 | 000 00011010 |
| MUXL_1 | 000 11111011 | AX22C01_1 | 000 00010011 |
| MUX2XO_2 | 000 00011100 | AX22C11_2 | 000 00010010 |
| MUX2XO_1 | 000 00010101 | AX22C11_1 | 000 00011001 |
| MUX2L_2 | 000 01000001 | OA21_2 | 000 00101000 |
| MUX2L_1 | 000 01001000 | OA21_1 | 010 00101000 |
| AO21_4 | 000 01001011 | OA121_3 | 000 01000001 |
| AO21_3 | 000 01101011 | OA121_2 | 000 01001000 |
| OAI21_1 | 010 01000000 | HZ_1 | 000 00000011 |
| OA21C01_1 | 010 00100001 | BUFZ_2 | 000 00000011 |
| OAI21C0_1 | 010 00100001 | BUFZ_1 | 000 00000011 |
| OA21C1_4 | 000 00101001 | BUFZ2_2 | 000 00000011 |
| OA21C1_3 | 000 00100010 | BUFZ2_1 | 000 00000011 |
| OA21C1_2 | 000 00101000 | INVZ_2 | 000 00000001 |
| OA21C1_1 | 010 00101000 | INVZ_1 | 000 00000010 |
| OAI21C1_3 | 000 01001001 | FDZQ_2 | 000 10000011 |
| OAI21C1_2 | 000 01000010 | FDZQ_1 | 000 10000011 |
| OAI21C1_1 | 010 01001000 | FDZQ2_2 | 000 10000011 |
| OA22_1 | 000 00100000 | FDZQ2_1 | 000 10000011 |
| OA22C01_2 | 000 00100001 | FD_4 | 000 10000011 |
| OA22C01_1 | 000 00101000 | FD_3 | 010 10001011 |
| OA22C11_1 | 000 00100010 | FD_2 | 010 10001011 |
| OA22C11_2 | 000 00101001 | FD_1 | 000 10000011 |
| OAI22_1 | 000 01000000 | FD2_4 | 000 10001011 |
| OAI22C0_2 | 000 01000001 | FD2_3 | 010 10101011 |
| OAI22C0_1 | 000 01001000 | FD2_2 | 010 10101011 |
| OX21_2 | 000 00010001 | FD2_1 | 000 10001011 |
| OX21_1 | 010 00010000 | LD_1 | 110 01101010 |
| OXN21_1 | 010 00010001 | LDL_1 | 110 01101011 |
| OX22_1 | 000 00010000 | FDE_1 | 110 10000101 |
| OX22C01_2 | 000 00011000 | FDEL_1 | 110 10001100 |
| OX22C01_1 | 000 00010001 | FDHA_4 | 000 10100100 |
| ANINV_4 | 000 00101001 | FDHA_3 | 000 10101001 |
| ANINV_3 | 000 00100100 | FDHA_2 | 010 10101100 |
| ANINV_2 | 010 00100100 | FDHA_1 | 000 10100010 |
| ANINV_1 | 000 00100010 | FDHAFB_2 | 110 10101001 |
| AN2C12Q_3 | 000 00100010 | FDHAFB_1 | 110 10100100 |
| AN2C12Q_2 | 000 00101001 | CR0_1 | 110 10001011 |
| AN2C12Q_1 | 000 01101100 | CRST_2 | 110 10101001 |
| NO22Q_5 | 000 01101011 | CRST_1 | 110 10100100 |
| NO22Q_4 | 000 01101011 | CR1_2 | 110 10101001 |
| NO22Q_3 | 000 01101011 | CR1_1 | 110 10100100 |
| NO22Q_2 | 000 01100001 | FDMUX_2 | 000 10000101 |
| NO22Q_1 | 000 00110101 | FDMUX_1 | 000 10001100 |
| XOND_3 | 000 01011001 | FDMUXFB0_1 | 110 10000101 |
| XOND_2 | 010 01011000 | FDMUXFB1_1 | 110 10001100 |
| XOND_1 | 000 01010010 | PSC1_2 | 000 10000101 |
| NDND_1 | 000 01000100 | PSC1_1 | 000 10001100 |
| XOND3_4 | 000 01010100 | SRPST_2 | 000 10000101 |
| XOND3_3 | 000 01010100 | SRPST_1 | 000 10001100 |
| XOND3_2 | 000 01010100 | FDN_4 | 000 10001011 |
| XOND3_1 | 000 01010100 | FDN_3 | 000 10001011 |
| HAL1_3 | 000 01011001 | FDN_2 | 000 10001011 |
| HAL1_2 | 010 01011000 | FDN_1 | 000 10001011 |
| HAL1_1 | 000 01010010 | FDN2_4 | 000 10011011 |
| LZ_1 | 000 00000001 | FDN2_3 | 000 10011011 |
| FDN2_2 | 000 10011011 | | |
| FDN2_1 | 000 10011011 | | |
| FDNAND_2 | 000 10000100 | | |
| FDNAND_1 | 000 10000100 | | |
| FDND_2 | 000 10100100 | | |
| FDND_1 | 000 10100100 | | |
| FDNFB_1 | 110 10001011 | | |
| FDOR_1 | 010 10000001 | | |
| FDORN_3 | 000 10001010 | | |
| FDORN_2 | 010 10001001 | | |
| FDORN_1 | 000 10000011 | | |
| FDAN_2 | 000 10000011 | | |
| FDAN_1 | 010 10001011 | | |
| FDR_2 | 000 10000011 | | |
| FDR_1 | 010 10001011 | | |
| FDS_3 | 000 10001010 | | |
| FDS_2 | 010 10001001 | | |
| FDS_1 | 000 10000011 | | |
| FDAX_1 | 000 10001011 | | |
| FDOX_1 | 000 10000000 | | |
| FDX3AN_2 | 000 10100100 | | |
| FDX3AN_1 | 000 10100100 | | |
| FDX_4 | 000 10001001 | | |
| FDX_3 | 000 10000100 | | |
| FDX_2 | 000 10000010 | | |
| FDX_1 | 010 10001100 | | |
| FDXFB_2 | 110 10001001 | | |
| FDXFB_1 | 110 10000100 | | |
| FT_2 | 110 10001001 | | |
| FT_1 | 110 10000100 | | |
| FDOXF_1 | 000 10001001 | | |
| FDOXFB_1 | 110 10001001 | | |
| FDAXF_1 | 000 10000100 | | |
| FDAXFB_1 | 110 10000100 | | |
| FTR_1 | 110 10001001 | | |
| FTRA_2 | 110 10001001 | | |
| FTRA_1 | 110 10000100 | | |
| FTS_1 | 110 10000100 | | |
| CLKEDG_1 | 010 10001011 | | |

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

What is claimed is:

1. A programmable logic cell comprising at least first and second logic outputs, the first logic output having a first multiplexer corresponding thereto, the second logic output having a second multiplexer corresponding thereto, each of said first and second multiplexers having a plurality of inputs and an output, the output of each of said first and second multiplexers being connected to its corresponding logic output, said programmable logic cell further comprising:

a connection from the output of the second multiplexer to a first one of the plurality of inputs of the first multiplexer.

2. The programmable logic cell of claim 1 further comprising first and second logic gates, each of said first and second logic gates being configurable to perform one of a predetermined set of logic functions on logic cell inputs, each of said first and second logic gates having an output, the output of the first logic gate being connected to a second one of the plurality of inputs of the first multiplexer, the output of the second logic gate being connected to a first one of the plurality of inputs of the second multiplexer.

3. The programmable logic cell of claim 2 further comprising third and fourth logic gates, each of said third and fourth logic gates having a first and second input, the first input of at least one of the third and fourth logic gates being connected to the output of the first logic gate, and the second input of at least one of the third and fourth logic gates being connected to the output of the second logic gate.

4. The programmable logic cell of claim 3 wherein the third and fourth logic gates each has an output, the output of the third logic gate being connected to a second one of the plurality of inputs of said second multiplexer, the output of the fourth logic gate being connected to a third one of the plurality of inputs of said first multiplexer.

5. The programmable logic cell of claim 4 wherein the output of the third logic gate is connected to a fourth one of the plurality of inputs of said first multiplexer, and wherein the output of the fourth logic gate is connected to a third one of the plurality of inputs of the second multiplexer.

6. The programmable logic cell of claim 5 further comprising a connection from the output of the first multiplexer to a fourth one of the plurality of inputs of the second multiplexer.

7. The programmable logic cell of claim 3 further comprising a data storage circuit having an input connected to the output of one of the third and fourth logic gates, the data storage circuit further having an output connected to a second one of the plurality of inputs of the first multiplexer.

8. The programmable logic cell of claim 3 further comprising a buffer or inverter having an input connected to the output of one of the third and fourth logic gates, the buffer or inverter further having an output connected to a second one of the plurality of inputs of the first multiplexer.

9. The programmable logic cell of claim 1 further comprising third and fourth logic gates, each of said third and fourth logic gates having an output, the output of the third logic gate being connected to a first one of the plurality of inputs of the second multiplexer, the output of the fourth logic gate being connected to a second one of the plurality of inputs of the second multiplexer.

10. The programmable logic cell of claim 9 further comprising a data storage circuit having an input connected to the output of the fourth logic gate, the data storage circuit further having an output connected to a second one of the plurality of inputs of the first multiplexer.

11. The programmable logic cell of claim 10 further comprising a connection from the output of the first multiplexer to a third one of the plurality of inputs of the second multiplexer.

12. The programmable logic cell of claim 9 further comprising a buffer or inverter having an input connected to the output of the third logic gate, the buffer or inverter further having an output connected to a second one of the plurality of inputs of the first multiplexer.

13. The programmable logic cell of claim 12 further comprising a connection from the output of the first multiplexer to a third one of the plurality of inputs of the second multiplexer.

14. The programmable logic cell of claim 1 further comprising a connection from the output of the first multiplexer to a first one of the plurality of inputs of the second multiplexer.

15. The programmable logic cell of claim 14 further comprising:

first and second logic gates, said first and second logic gates being configurable to perform one of a predetermined set of logic functions on logic cell inputs;

third and fourth logic gates;

wherein a second one of the plurality of inputs of the first multiplexer is connected to an output of one of the first, second, third and fourth logic gates; and wherein a second one of the plurality of inputs of the second multiplexer is connected to an output of one of the first, second, third and fourth logic gates.

* * * * *

UNITED STATES PATENT AND TRADEMARK OFFICE
CERTIFICATE OF CORRECTION

PATENT NO. : 5,748,009
DATED : May 5, 1998
INVENTOR(S) : Bertolet et al.

It is certified that error appears in the above-identified patent and that said Letters Patent is hereby corrected as shown below:

Column 5, Line 23      "logic ate" should read --logic gate--

Signed and Sealed this

Eighth Day of December, 1998

*Attest:*

BRUCE LEHMAN

*Attesting Officer*      *Commissioner of Patents and Trademarks*